United States Patent
Zhang et al.

(10) Patent No.: US 10,453,795 B2
(45) Date of Patent: Oct. 22, 2019

(54) MICROPROCESSOR PACKAGE WITH FIRST LEVEL DIE BUMP GROUND WEBBING STRUCTURE

(71) Applicant: Intel Corporation, Santa Clara, CA (US)

(72) Inventors: Yu Amos Zhang, Santa Clara, CA (US); Mathew J. Manusharow, Phoenix, AZ (US); Kemal Aygun, Chandler, AZ (US); Mohiuddin Mazumder, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/773,896

(22) PCT Filed: Dec. 26, 2015

(86) PCT No.: PCT/US2015/000431
§ 371 (c)(1),
(2) Date: May 4, 2018

(87) PCT Pub. No.: WO2017/111855
PCT Pub. Date: Jun. 29, 2017

(65) Prior Publication Data
US 2018/0331035 A1    Nov. 15, 2018

(51) Int. Cl.
*H01L 23/50* (2006.01)
*H01R 13/6471* (2011.01)
(Continued)

(52) U.S. Cl.
CPC .......... *H01L 23/5286* (2013.01); *H01L 23/48* (2013.01); *H01L 23/49838* (2013.01);
(Continued)

(58) Field of Classification Search
CPC . H01L 25/0655; H01L 23/48; H01L 23/5384; H01L 23/552; H01L 23/66;
(Continued)

(56) References Cited

U.S. PATENT DOCUMENTS 7,038,319 B2    5/2006 Buffet et al.
7,514,789 B1    4/2009 Tao et al.
(Continued)

FOREIGN PATENT DOCUMENTS

JP    2005-072581    3/2005

OTHER PUBLICATIONS

International Search Report and Written Opinion for International Patent Application No. PCT/US2015/000431 dated Sep. 27, 2016, 17 pgs.
(Continued)

*Primary Examiner* — Nikolay K Yushin
(74) *Attorney, Agent, or Firm* — Schwabe, Williamson & Wyatt, P.C.

(57) ABSTRACT

A ground isolation webbing structure package includes a top level with an upper interconnect layer having upper ground contacts, upper data signal contacts, and a conductive material upper ground webbing structure that is connected to the upper ground contacts and surrounds the upper data signal contacts. The upper contacts may be formed over and connected to via contacts or traces of a lower layer of the same interconnect level. The via contacts of the lower layer may be connected to upper contacts of a second interconnect level which may also have such webbing. There may also be at least a third interconnect level having such webbing. The webbing structure electrically isolates and reduces cross talk between the signal contacts, thus providing higher frequency and more accurate data signal transfer between devices such as integrated circuit (IC) chips attached to a package.

17 Claims, 13 Drawing Sheets

(51) Int. Cl.
*H05K 1/02* (2006.01)
*H01L 23/528* (2006.01)
*H01L 23/48* (2006.01)
*H01L 23/00* (2006.01)
*H01L 23/498* (2006.01)
*H01L 23/66* (2006.01)

(52) U.S. Cl.
CPC .............. *H01L 23/50* (2013.01); *H01L 23/66* (2013.01); *H01L 24/14* (2013.01); *H01L 24/17* (2013.01); *H01L 24/81* (2013.01); *H01R 13/6471* (2013.01); *H05K 1/0243* (2013.01); H01L 24/13 (2013.01); H01L 24/16 (2013.01); H01L 2224/13101 (2013.01); H01L 2224/1412 (2013.01); H01L 2224/16225 (2013.01); H01L 2224/1715 (2013.01); H01L 2224/17515 (2013.01); H01L 2224/81801 (2013.01); H01L 2924/14 (2013.01)

(58) Field of Classification Search
CPC .............. H01L 23/49827; H01L 23/50; H01L 23/49838; H01L 2924/15192; H01L 2924/15311; H01L 2924/00014; H01L 2924/14; H01L 2924/1432; H01L 2924/1433; H01L 2924/3025; H01L 2924/014; H01L 2224/131; H01L 2224/16227; H01L 23/5286; H01L 24/14; H01L 24/17; H01L 24/81; H01L 24/13; H01L 24/16; H01L 2224/81801; H01L 2224/13101; H01L 2224/1412; H01L 2224/16225; H01L 2224/17515; H01L 2224/1715; H01R 13/6471; H01R 13/2407; H01R 13/00; H05K 1/0243; H05K 1/0266; H05K 1/185; H05K 1/181
See application file for complete search history.

(56) References Cited

U.S. PATENT DOCUMENTS

| | | | |
|---|---|---|---|
| 8,236,612 B2 * | 8/2012 | San Antonio | ........... H01L 24/37 438/113 |
| 2008/0248693 A1 | 10/2008 | Winings et al. | |
| 2011/0111562 A1 * | 5/2011 | San Antonio | ....... H01L 21/4832 438/113 |
| 2011/0193233 A1 | 8/2011 | Jiang et al. | |
| 2015/0145132 A1 | 5/2015 | Ramakrishnan et al. | |

OTHER PUBLICATIONS

International Preliminary Report on Patentablity for International Patent Application No. PCT/US2015/000431, dated Jul. 5, 2018, 12 pages.

* cited by examiner

MICROPROCESSOR PACKAGE WITH FIRST LEVEL DIE BUMP GROUND WEBBING STRUCTURE

CROSS-REFERENCE TO RELATED APPLICATION

This patent application is a U.S. National Phase Application under 35 U.S.C. § 371 of International Application No. PCT/US2015/000431, filed Dec. 26, 2015, entitled "MICROPROCESSOR PACKAGE WITH FIRST LEVEL DIE BUMP GROUND WEBBING STRUCTURE," which designates the United States of America, the entire disclosure of which is hereby incorporated by reference in its entirety and for all purposes.

BACKGROUND

Field

Embodiments of the invention are related in general, to semiconductor device packaging and, in particular, to substrate packages and printed circuit board (PCB) substrates upon which an integrated circuit (IC) chip may be attached, and methods for their manufacture. Such a substrate package device may have a first level die bump design directly attached to via contacts and conductive contacts extending through lower vertical levels of the package device.

Description of Related Art

Integrated circuit (IC) chips (e.g., "chips", "dies", "ICs" or "IC chips"), such as microprocessors, coprocessors, graphics processors and other microelectronic devices often use package devices ("packages") to physically and/or electronically attach the IC chip to a circuit board, such as a motherboard (or motherboard interface). The IC chip (e.g., "die") is typically mounted within a microelectronic substrate package that, among other functions, enables electrical connections between the die and a socket, a motherboard, or another next-level component.

There is a need in the field for an inexpensive and high throughput process for manufacturing such packages. In addition, the process could result in a high package yield and a package of high mechanical stability. Also needed in the field, is a package having better components for providing stable and clean power, ground, and high frequency transmit and receive data signals between its top surface and other components of or attached to the package, such as from contacts on the top surfaces that will be electrically connected through via contacts to lower level contacts or traces of the package.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1:
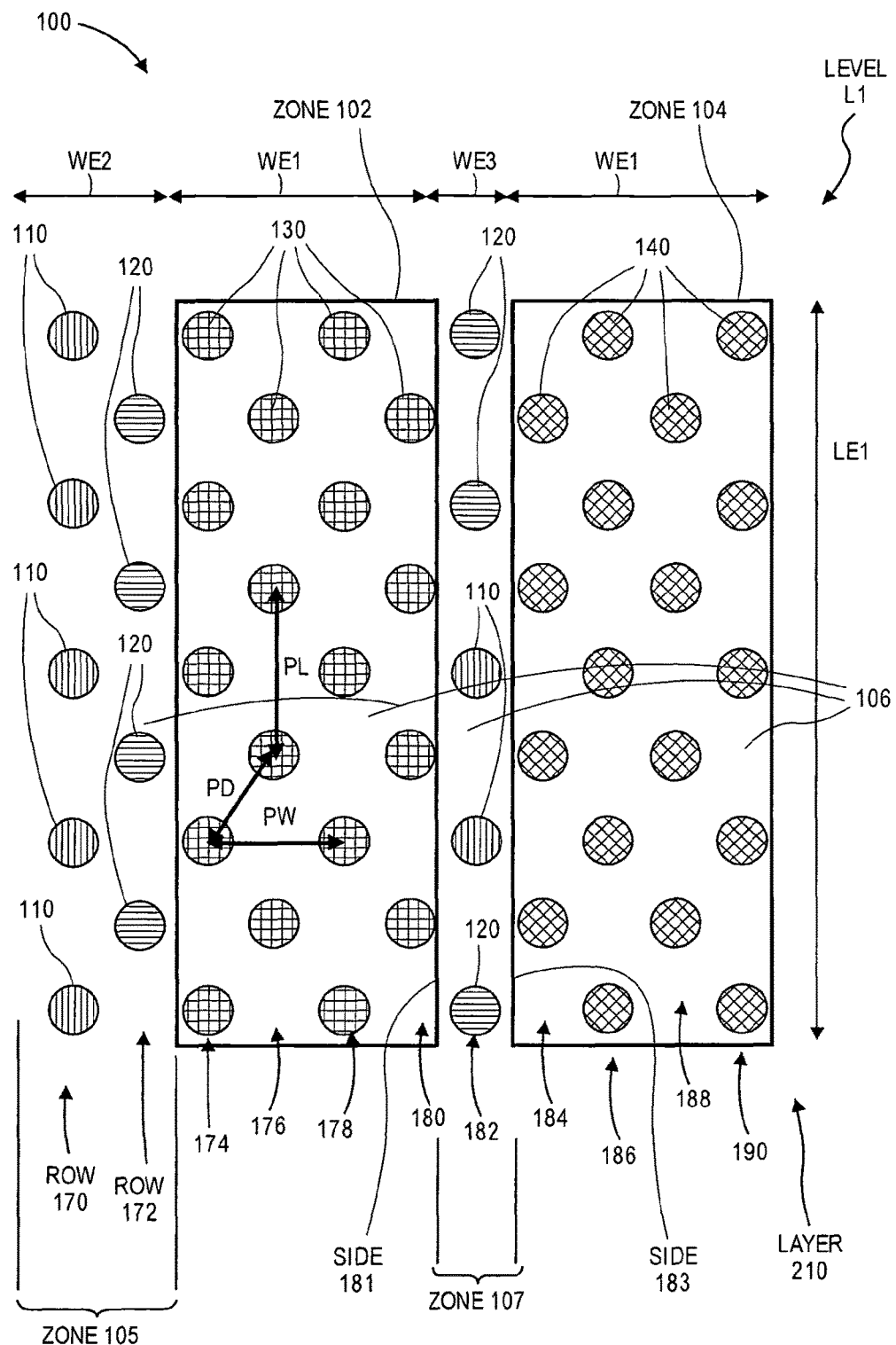
FIG. 1 is a schematic top perspective view of a conductive material ground isolation webbing structure semiconductor device package upon which at least one integrated circuit (IC) chip or "die" may be attached.

Several embodiments of the invention with reference to the appended drawings are now explained. Whenever the shapes, relative positions and other aspects of the parts described in the embodiments are not clearly defined, the scope of embodiments of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

As integrated circuit (IC) chip or die sizes shrink and interconnect densities increase, physical and electrical connections between the IC chip and a package upon or to which the IC chip is mounted require better components for providing stable and clean power, ground, and high frequency transmit and receive data signals between the package top surface and other components of or attached to the package. Such signals may be transmitted between contacts on the top surfaces of the package that will be electrically connected through via contacts to lower level contacts or traces of the package. In some cases, the IC chip may be mounted on (e.g., physically soldered and attached to a top surface of the package) a microelectronic substrate package, which is also physically and electronically connected to the next-level component.

In some cases, the IC chip may be mounted within the package, such as for "flip chip" bonding or packaging. In some cases, the IC chip may be mounted on a microelectronic substrate package, which is also physically and electronically connected to another IC chip, so that the package can provide data signal transfer between two IC chips. Here, in many cases, the package must route hundreds or even thousands of high frequency data signals between two die. Some such packages may be or use a silicon interposer, a silicon bridge, or an organic interposer technology.

According to some embodiments, it is possible for such a package to provide higher frequency and more accurate data signal transfer between an IC chip mounted on a top interconnect level of the package and (1) lower levels of the package, (2) a next-level component mounted on the package, or (3) another IC chip mounted on the package (e.g., mounted on the top level) by including a top interconnect level (e.g., a die-bump field or a first level die bump design) with a ground webbing structure (e.g., "webbing") of conductor material that reduces bump field crosstalk, signal type cluster-to-cluster crosstalk and in-cluster signal type crosstalk. The ground webbing structure may be spread over an area of the top interconnect level of the package and may provide ground isolation conductive material webbing that surrounds data signal contacts of the top interconnect level. The top interconnect level may have upper transmit and receive data signal contacts of the die-bump field or a first level die bump design for soldering to another device; and the ground webbing structure may be attached to (or formed as part of conductor material layer with) upper grounding contacts to reduce bump field crosstalk, signal type cluster-to-cluster crosstalk and in-cluster signal type crosstalk by surrounding each of the upper transmit and receive data signal contacts. In some cases, there may be additional lower levels of the package (below the first level) with additional ground webbing structures, such as in a second interconnect level, and a third interconnect level of the package. Such a package (e.g., with the top interconnect level having the ground webbing structure, and optionally one or more lower levels also having the ground webbing structure) may be described as a first level die bump "ground webbing structure" microprocessor package (e.g., devices, systems and processes for forming).

In some cases, each interconnect level having a ground webbing structure may have an upper (e.g., top or first) interconnect layer with upper (e.g., top or first) level ground contacts, upper level (e.g., top or first) data signal contacts, and a upper (e.g., top or first) level ground webbing structure that is directly connected (e.g., attached to, formed as part of, or electrically coupled to) to the upper level ground contacts and surrounds the upper data signal contacts. The upper contacts may be formed over and connected to via contacts or traces of a lower layer of the same interconnect level. The via contacts of the lower layer may be connected to upper contacts of a second interconnect level (which may also have webbing). In some cases, the upper data signal contacts include upper data transmit signal contacts in a data transmit signal zone (or area from above view), and upper data receive signal contacts in a data receive signal zone. In some cases, upper level power contacts are disposed adjacent to the upper level ground contacts in a power and ground zone that is between the data transmit signal zone and the data receive signal zone. In some cases, the ground webbing structure extends from the upper ground contacts (1) through a first side of the power and ground zone and into the data transmit signal zone and surrounds the upper data transmit signal contacts; and (2) through an opposite side (e.g., opposite from the first side) of the power and ground zone and into the data receive signal zone and surrounds the upper data receive signal contacts.

In some cases, the ground webbing structure package may provide a better component for the physical and electrical connections between the IC chip and a package upon or to which the IC chip is mounted. In some cases, it may increase in the stability and cleanliness of power, ground, and high frequency transmit and receive data signals transmitted between the data signal contacts on the top surfaces of the package and other components of or attached to the package that are electrically connected to the data signal contacts on the top surface through via contacts to lower level contacts or traces of the package. In some cases, it may increase the usable frequency of transmit and receive data signals transmitted between the data signal contacts on the top surfaces of the package and other components of or attached to the package, as compared to a package not having ground webbing (e.g., as compared to a package where the top interconnect layer ground webbing structure does not exist). Such an increased frequency may include data signals having a frequency of between 7 and 25 gigatransfers per second (GT/s). In some cases, GT/s may refer to a number of operations (e.g. transmission of digital data such as the data signal herein) transferring data that occur in each second in some given data transfer channel such as a channel provided by zone 102 or 104; or may refer to a sample rate, i.e. the number of data samples captured per second, each sample normally occurring at the clock edge. 1 GT/s is $10^9$ or one billion transfers per second.

In some cases, the webbing structure package improves crosstalk (e.g., as compared to the same package but without any webbing, such as without webbing on levels L1-L3) from very low frequency transfer such as from 50 mega hertz (MHz) to a GHz transfer level, such as greater than 40 GHz (or up to between 40 and 50 GHz). In some cases, the webbing structure package improves copper density in the package device (e.g., as compared to the same package but without any webbing, such as without webbing on levels L1-L3). In some cases, the webbing structure package enhances the power delivery network for the input/output block (e.g., IO block such as including zone 102 and 104) by improving (e.g., reducing resistance of) the ground impedance (e.g., as compared to the same package but without any webbing, such as without webbing on levels L1-L3), which helps to reduce the IO power network impedance (e.g., lower the resistance of power contacts in zones 105 and 107), such as due to the IO power bumps (e.g., contacts 110 in zone 105 and/or 107) being located inside of the signal bumps (e.g., contacts 130 and 140).

FIG. 1 is a schematic top perspective view of a semiconductor device package upon which at least one integrated circuit (IC) chip or "die" may be attached. FIG. 1 shows package 100 (e.g., a "package device") having a first interconnect level L1 with upper layer 210 having upper (e.g., top or first) layer power contacts 110, upper layer ground isolation contacts 120, upper layer receive data signal contacts 130 and upper layer transmit data signal contacts 140. Level L1 (or upper layer 210) may be considered to "top"

layer such as a top, topmost or exposed layer (e.g., a final build-up (BU) layer, BGA, LGA, or die-backend-like layer) to which an IC chip (e.g., such as microprocessor, coprocessor, graphics processor, memory chip, modem chip, or other microelectronic chip devices), a socket, an interposer, a motherboard, or another next-level component will be mounted or directly attached.

In some cases, device 100 may represent a substrate package, an interposer, a printed circuit board (PCB), a PCB an interposer, a "package", a package device, a socket, an interposer, a motherboard, or another substrate upon which integrated circuit (IC) chips or other package devices may be attached (e.g., such as microprocessor, coprocessor, graphics processor, memory chip, modem chip, or other microelectronic chip devices).

FIG. 1 shows package 100 having top surface 106, such as a surface of dielectric, upon or in which are formed (e.g., disposed) power contacts 110, grounding contacts 120, receive signal contacts 130 and transmit contacts 140. Power contacts 110 are shown in first row 170 as well as at certain locations along length LE1 in row 182.

Receive signal contacts 130 are shown in zone 102. Zone 102 has width WE1 and length LE1. Ground contacts 120 are shown in second row 172 and at certain locations along length LE1 in seventh row 182. Receive signal contacts 130 are shown in third row 174, fourth row 176, fifth row 178, and sixth row 180 in zone 102. In some cases, zone 102 may be described as a receive or "RX" signal cluster formed in a 4-row deep die-bump pattern.

Transmit signal contacts 140 are shown in zone 104. Zone 104 has width WE1 and length LE1. Transmit signal contacts 140 are shown in sixth row 184, seventh row 186, eighth row 188, and ninth row 190 in zone 104. In some cases, zone 104 may be described as a receive or "TX" signal cluster formed in a 4-row deep die-bump pattern. Various other appropriate patterns are considered for contacts 120, 130 and 140. It can be appreciated that although zone 102 and 104 are shown with the same width and length, they may have different widths and/or lengths. Each of rows 170-190 may be horizontally (e.g., widthwise) equidistant from each other along the direction of width WE1, and each of the contacts in each row may be vertically (e.g., lengthwise) equidistant from each other along length LE1.

The exact size of WE1 and LE1 may depend on number of contacts employed within each zone (e.g., number of contacts 130 in zone 102, or the number of contact 140 in zone 104). In some cases, the size of WE1 and LE1 may also depend on the number of zones 102 and 104 on a package device. In some cases, the number of zones 102 and 104 will be where each of those zones is part of a "unicel" or "unit cell" communication area (e.g., including zones 102, 104, 105 and 107) and there are between 2-20 such unicel areas on the surface of the package (and thus between 2-20 of each of zones 102 and 104). In some cases, the size of WE1 and LE1 can be scaled with or depend on the manufacturing or processing pitch (e.g., of the contacts).

The size of WE1 and LE1 may also depend on the technology capability of forming the contacts and package. In some cases, in general, the size of WE1 and LE1 can span from around a hundred to a couple of hundred micrometers (×E-6 meter—"um" or "microns"). In some cases, LE1 is between 80 and 250 um. In some cases it is between 50 and 300 um. In some cases, WE1 is between 70 and 150 um. In some cases it is between 40 and 200 um.

Rows 170 and 172 may be described as a two row wide power and ground isolation zone 105. Zone 102 may be described as a four row wide zone of receive contacts. Zone 104 a four row wide zone of transmit contacts. Row 182 may be described as a one row wide power and ground isolation zone 107 located or formed between zone 102 and zone 104. Zone 107 has side 181 adjacent to or facing zone 102 and opposite side 183 (e.g., opposite from side 181) adjacent to or facing zone 104. In some cases, the location of zone 105 and zone 107 are reversed and the two row power and isolation zone is located between zone 102 and zone 104; and has sides 181 and 183.

Zone 105 has width WE2 and length LE1. Zone 107 has width WE3 and length LE1. The exact size of WE2 and WE3 may depend on number of contacts employed within each zone (e.g., number of contacts in zone 105, and in zone 107). In some cases, the size of WE2 and WE3 may also depend on the number of zones 105 and 107 on a package device. In some cases, the number of zones 105 and 107 will be where each of those zones is part of a "unicel" communication area (e.g., including zones 102, 104, 105 and 107) and there are between 2-20 such unicel areas on the surface of the package (and thus between 2-20 of each of zones 105 and 107). In some cases, the size of WE2 and WE3 can be scaled with or depend on the manufacturing or processing pitch (e.g., of the contacts).

The size of WE2 and WE3 may also depend on the technology capability of forming the contacts and package. In some cases, in general, the size of WE2 and WE3 can span from around tens of microns to more than a hundred um. In some cases, WE2 is between 35 and 75 um. In some cases it is between 20 and 100 um. In some cases, WE3 is between 15 and 30 um. In some cases it is between 8 and 40 um. It can be appreciated that although zone 105 and 107 are shown with widths WE 2 and WE3; and the same length, they may have different widths and/or lengths.

In some cases, zone 107 (or zone 105 when zone 105 is located where zone 107 is shown) may be described as one (e.g., zone 107) or two (e.g., zone 105) rows of ground bumps that isolate the TX cluster (e.g., zone 104) and the RX cluster (e.g., zone 102).

The pitch width (PW) of adjacent contacts is the width distance between the center point of two adjacent contacts. In some cases, pitch PW is approximately 153 micrometers (153×E-6 meter—"um"). In some cases, pitch PW is approximately 160 micrometers. In some cases, it is between 140 and 175 micrometers. The diagonal pitch (PD) of adjacent contacts is the diagonal distance between the center of two adjacent contacts. In some cases, pitch PD is approximately 110 micrometers (110×E-6 meter—"um"). In some cases, pitch PD is approximately 130 micrometers. In some cases, it is between 100 and 140 micrometers (um). In some cases, it is between 60 and 200 micrometers. The pitch length (PL) of two adjacent contacts is the length distance between the center point of two adjacent contacts. In some cases, pitch PL is approximately 158 micrometers. In some cases, pitch PL is approximately 206 micrometers. In some cases, it is between 130 and 240 micrometers (um). In some cases, pitch PD is approximately 110 micrometers, PL is approximately 158 micrometers and PW is approximately 153 micrometers. In some cases, pitch PD is approximately 130 micrometers, PL is approximately 206 micrometers and PW is approximately 160 micrometers. In the cases above, "approximately" may represent a difference of within plus or minus 5 percent of the number stated. In other cases, it may represent a difference of within plus or minus 10 percent of the number stated.

According to embodiments, level L1 may include upper (e.g., top, topmost or first) layer ground webbing structure 160 (not shown in FIG. 1), such as shown in FIGS. 2-3.

Figure 2A:
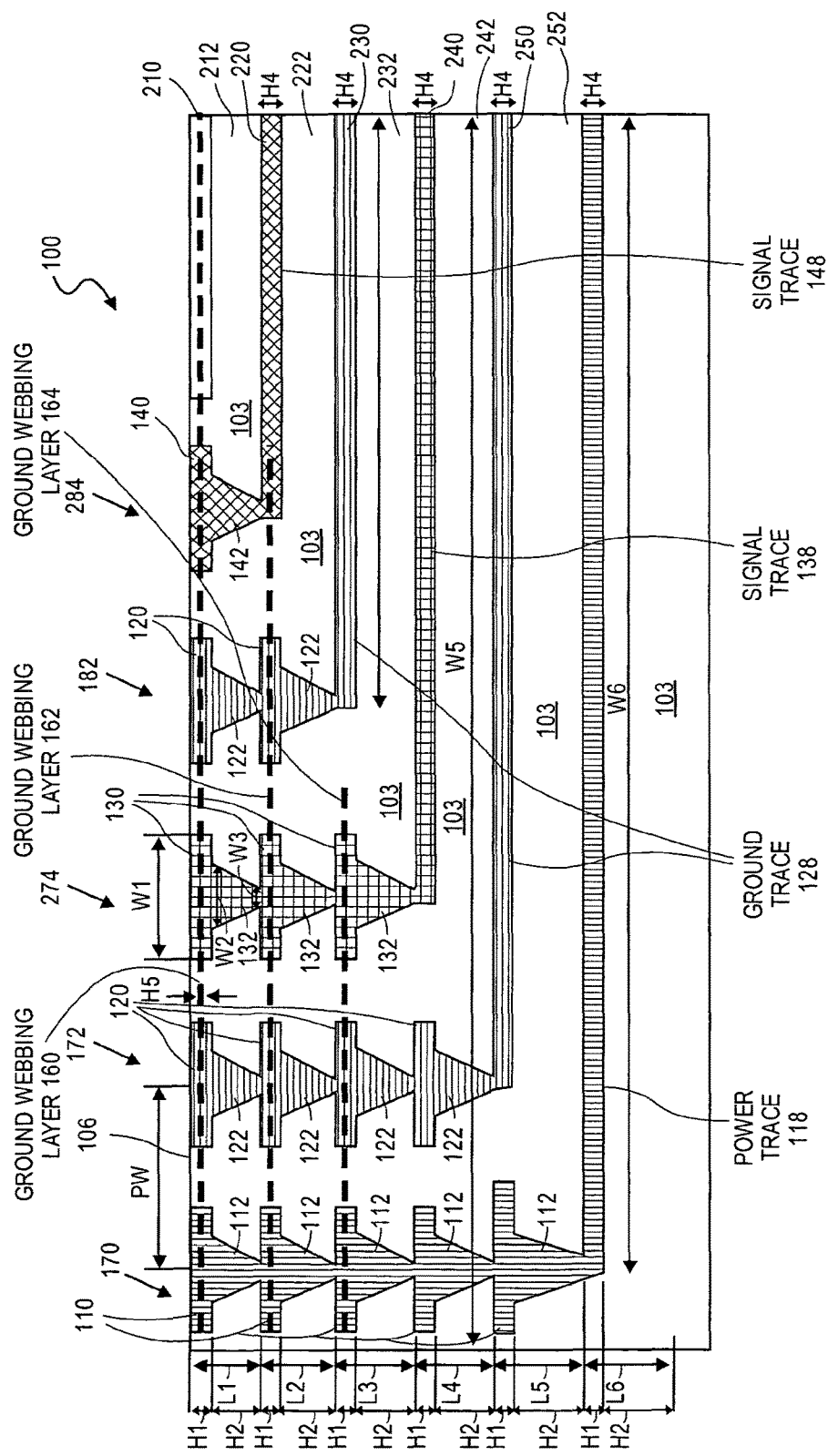
FIG. 2A is a schematic cross-sectional side view of FIG. 1 showing ground webbing structures as dashed "----" lines and showing data signal receive and transmit interconnect stacks.
Figure 2B:
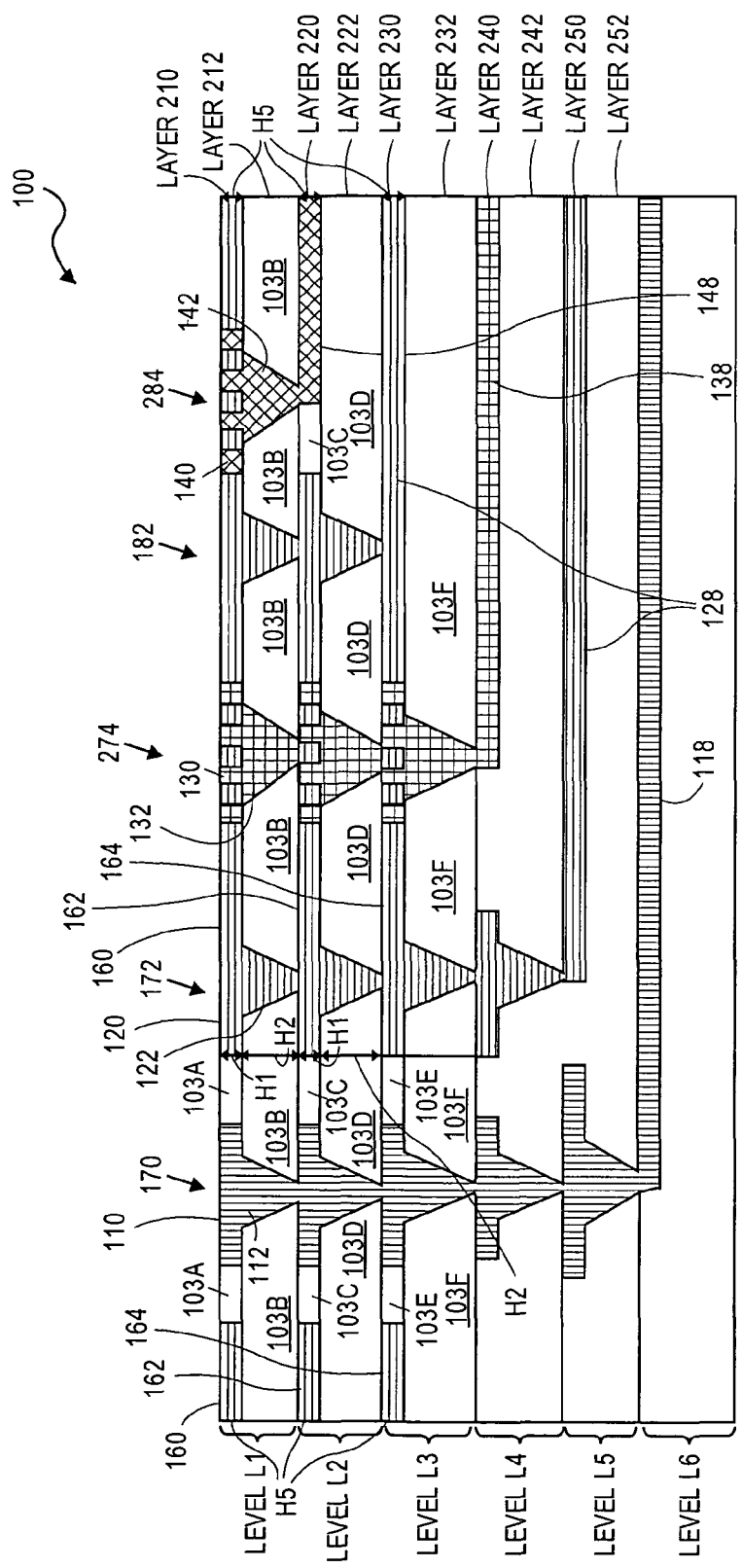
FIG. 2B is a schematic cross-sectional side view of FIG. 1 showing ground webbing structures as solid lines and not showing data signal receive and transmit interconnect stacks.

FIG. 2A is a schematic cross-sectional side view of the package of FIG. 1 showing ground Webbing structures 160, 162 and 164 as dashed "----" lines and showing data signal receive and transmit interconnect stacks or rows 174 and 184. FIG. 2B is a schematic cross-sectional side view of the package of FIG. 1 showing ground webbing structures 160, 162 and 164 as solid lines and not showing data signal receive and transmit interconnect stacks or rows 174 and 184. FIGS. 2A-B show package 100 top or topmost (e.g., first level) interconnect level L1 is formed over second level interconnect level L2, which is formed over third interconnect level L3, which is formed over fourth interconnect level L4, which is formed over fifth interconnect level L5, which is formed over fifth interconnect level L6. In FIGS. 2A-B, data signal receive interconnect stack 274 may represent the interconnect stack (e.g., upper contacts and via contacts of multiple levels of levels L1-L5) of each of rows 174-180 of FIGS. 1 and 3. In some cases, stack 274 may represent all the interconnect stack of rows 174-180 of FIGS. 1 and 3. Also, in FIGS. 2A-B, data signal transmit interconnect stack 284 may represent the interconnect stack (e.g., upper contacts and via contacts of multiple levels of levels L1-L5) of each of rows 184-190 of FIGS. 1 and 3. In some cases, stack 284 may represent all the interconnect stack of rows 184-190 of FIGS. 1 and 3.

FIG. 2A shows package device 100 having level L1 which is shown with layer 210 having dielectric 103; contacts 110, 120, 130 and 140; and ground webbing 160 which may be directly attached to and electrically coupled to contacts 120 of layer 210. Level L1 is also shown with layer 212 having dielectric 103; and contacts 112, 122, 132 and 142. Level L2 is shown with layer 220 having contacts 110, 120 and 130; ground webbing 162 which may be directly attached to and electrically coupled to contacts 120 of layer 220; and signal trace 148 which may be directly attached to and electrically coupled to contacts 142 of layer 212. Level L2 is also shown with layer 222 having dielectric 103; and contacts 112, 122 and 132. Level L3 is shown with layer 230 having contacts 110, 120 and 130; ground webbing 164 which may be directly attached to and electrically coupled to contacts 120 of layer 230; and ground trace (or plane) 128 which may be directly attached to and electrically coupled to contacts 122 of layer 222. Level L3 is also shown with layer 232 having dielectric 103; and contacts 112, 122 and 132. Level L4 is shown with layer 240 having contacts 110 and 120; and signal trace 138 which may be directly attached to and electrically coupled to contacts 132 of layer 232. Level L4 is also shown with layer 242 having dielectric 103; and contacts 112 and 122. Level L5 is shown with layer 250 having contacts 110; and ground trace (or plane) 128 which may be directly attached to and electrically coupled to contacts 122 of layer 242. Level L5 is also shown with layer 252 having dielectric 103; and contacts 112. Level L6 is shown with a layer having power trace (or plane) 118 which may be directly attached to and electrically coupled to contacts 112 of layer 252. Level L6 may include other structure or various layers not shown, such as described below.

Below level L6, package 100 may include various interconnect layers, packaging layers, conductive features (e.g., electronic devices, interconnects, layers having conductive traces, layers having conductive vias), layers having dielectric material and other layers as known in the industry for a semiconductor device package. In some cases, the package may be cored or coreless. In some cases, the package includes features formed according to a standard package substrate formation processes and tools such as those that include or use: lamination of dielectric layers such as ajinomoto build up films (ABF), laser or mechanical drilling to form vias in the dielectric films, lamination and photo-lithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peel able core panel. The substrate may be a substrate used in an electronic device package or a microprocessor package.

In some cases, any or all of levels L1-L5 may also include such structures noted above for package 100, thought not shown in FIGS. 1-3. In some cases, the contacts and/or traces of levels L1-L5 are electrically connected to (e.g., physically attached to or formed onto) the conductive structures noted above for package 100.

Row 170 is shown having power interconnect levels L1-L5. In some embodiments, row 170 has fewer or more interconnect levels than L1-L5. Each of levels L1-L5 may have at least one power interconnect stack with a power upper contact 110 (e.g., of an upper of the level such as layer 210 of level L1) formed over or onto a power via contact 112 (e.g., of a lower layer of the level such as layer 212 of level L1) such that the two contacts are directly attached (e.g., touching) and electrically coupled to each other. Each layers power via contact 112 (e.g., of the lower layer of the level) may be formed over or onto an power upper contact 110 of the level below (e.g., of an upper layer of the level below such as layer 220 of level L2), such that the two contacts are directly attached (e.g., touching) and electrically coupled to each other. Each power upper contact 110 may have width, or diameter W1 and height H1. Each power via contact 112 may have top width W2, bottom width W3, and height H2. These widths and height may be the same for each power upper contact and power via contact of interconnect levels L1-L5. Power via contact 112 of level L5 (e.g., of the lowest power via level of an interconnect stack) is formed over or onto power signal trace 118 such that the via contact is directly attached (e.g., touching) and electrically coupled to power signal trace 118. Trace 118 has height H4 and width W6. It can be appreciated that power contacts 110 and 112; and trace 118 may have width and/or height less than or greater than those mentioned above.

Zones 102, 104, 105 and 107 (and levels L1-L5) may have features having standard package pitch as known for a semiconductor die package, chip package; or for another device (e.g., interface, PCB, or interposer) typically connecting a die (e.g., IC, chip, processor, or central processing unit) to a socket, a motherboard, or another next-level component.

In some cases, height H1 may be approximately 15 micrometers (15×E-6 meter—"um") and width W1 is between 75 and 85 um. In some cases, height H1 is between 10 and 20 micrometers (um). In some cases, it is between 5 and 30 micrometers. In some cases, width W1 is between 70 and 90 micrometers (um). In some cases, it is between 60 and 110 micrometers. It can be appreciated that height H1 may be an appropriate height of a conductive material contacts formed on a top layer of or within a package device, that is less than or greater than those mentioned above.

In some cases, H2 is approximately 25 micrometers, width W2 is between 65 and 75 urn, and width W3 is between 30 and 50 um. In some cases, height H2 is between 20 and 30 micrometers (um). In some cases, it is between 10 and 40 micrometers. It can be appreciated that height H1 may be an appropriate height of a conductive material via contact within a package device, that is less than or greater than those mentioned above. In some cases, width W2 is between 60 and 85 micrometers (um). In some cases, it is between 50 and 90 micrometers. In some cases, width W3 is between 20 and 50 micrometers (um). In some cases, it is between 10 and 60 micrometers.

In some cases, height H4 may be approximately 15 micrometers (15×E-6 meter—"um") and width W6 is between 1 millimeter (mm) and 20 mm. In some cases, height H4 is between 10 and 20 micrometers (um). In some cases, it is between 5 and 30 micrometers. It can be appreciated that height H4 may be an appropriate height of a conductive material grounding plane or webbing within a package device for reducing cross talk and for isolating signal contacts, that is less than or greater than those mentioned above. In some cases, width W6 can span an entire width of a die or chip.

Row 172 is shown having ground isolation interconnect levels L1-L4. In some embodiments, row 172 has fewer or more interconnect levels than L1-L4. Each of levels L1-L4 may have at least one ground isolation interconnect stack with an ground isolation upper contact 120 (e.g., of an upper of the level such as layer 210 of level L1) formed over or onto a ground isolation via contact 122 (e.g., of a lower layer of the level such as layer 212 of level L1) such that the two contacts are directly attached (e.g., touching) and electrically coupled to, each other. Each layers ground isolation via contact 122 (e.g., of the lower layer of the level) may be formed over or onto a ground isolation upper contact 120 of the level below (e.g., of an upper layer of the level below such as layer 220 of level L2), such that the two contacts are directly attached (e.g., touching) and electrically coupled to each other. Each ground isolation upper contact 120 may have width, or diameter W1 and height H1. Each ground isolation via contact 122 may have top width W2, bottom width W3, and height H2. These widths and height may be the same for each ground isolation upper contact and ground isolation via contact of interconnect levels L1-L4. Ground isolation via contact 122 of level L4 (e.g., of the lowest ground isolation via level of an interconnect stack) is formed over or onto ground isolation signal trace 128 such that the via contact is directly attached (e.g., touching) and electrically coupled to ground isolation signal trace 128. Trace 128 has height H4 and may have a width such as width W6. It can be appreciated that ground isolation contacts 120 and 122; and trace 128 may have width and/or height less than or greater than those mentioned above.

Row 174 is shown having receive data signal interconnect levels L1-L3. In some embodiments, row 174 has fewer or more interconnect levels than L1-L3. Each of levels L1-L3 may have at least one receive data signal interconnect stack with an receive data signal upper contact 130 (e.g., of an upper of the level such as layer 210 of level L1) formed over or onto a receive data signal via contact 132 (e.g., of a lower layer of the level such as layer 212 of level L1) such that the two contacts are directly attached (e.g., touching) and electrically coupled to each other. Each layers receive data signal via contact 132 (e.g., of the lower layer of the level) may be formed over or onto a receive data signal upper contact 130 of the level below (e.g., of an upper layer of the level below such as layer 220 of level L2), such that the two contacts are directly attached (e.g., touching) and electrically coupled to each other. Each receive data signal upper contact 130 may have width, or diameter W1 and height H1. Each receive data signal via contact 132 may have top width W2, bottom width W3, and height H2. These widths and height may be the same for each receive data signal upper contact and receive data signal via contact of interconnect levels L1-L3. Receive data signal via contact 132 of level L3 (e.g., of the lowest receive data signal via level of an interconnect stack) is formed over or onto receive data signal trace 138 such that the via contact is directly attached (e.g., touching) and electrically coupled to receive data signal trace 138. Trace 138 has height H4 and may have a width such as width W6. It can be appreciated that receive data signal contacts 130 and 132; and trace 138 may have width and/or height less than or greater than those mentioned above.

FIGS. 2A-B show only stack 274 of rows 174-180. However, it can be appreciated that stack 274 can represent any one of rows 174-180. In some cases, stack 274 of FIGS. 2A-B is an example of all the rows 174-180 of FIGS. 1 and 3.

Row 182 is shown having ground isolation interconnect levels L1-L2. In some embodiments, row 182 has fewer or more interconnect levels than L1-L2. In some embodiments, row 182 has power interconnect stacks in levels L1-L2 as well as ground isolation interconnect stacks in levels L1-L2. Each of levels L1-L2 may have at least one ground isolation interconnect stack with an ground isolation upper contact 120 formed over or onto a ground isolation via contact 122, which is formed over or onto an ground isolation upper contact 120 of the layer below, as noted for row 172. These may be formed as noted for row 172. Ground isolation via contact 122 of level L2 (e.g., of the lowest ground isolation via level of an interconnect stack) is formed over or onto ground isolation signal trace 128 as noted for row 172. It can be appreciated that ground isolation contacts 120 and 122; and trace 128 of row 182 may have width and/or height as noted for row 172.

Row 184 is shown having transmit data signal interconnect level L1. In some embodiments, row 184 has more interconnect levels than L1. Level L1 may have at least one transmit data signal interconnect stack with an transmit data signal upper contact 140 (e.g., of an upper of the level such as layer 210 of level L1) formed over or onto a transmit data signal via contact 142 (e.g., of a lower layer of the level such as layer 212 of level L1) such that the two contacts are directly attached (e.g., touching) and electrically coupled to each other. Each layers transmit data signal via contact 142 (e.g., of the lower layer of the level) may be formed over or onto a transmit data signal upper contact 140 of the level below (e.g., of an upper layer of the level below such as layer 220 of level L2), such that the two contacts are directly attached (e.g., touching) and electrically coupled to each other. Each transmit data signal upper contact 140 may have width, or diameter W1 and height H1. Each transmit data signal via contact 142 may have top width W2, bottom width W3, and height H2. These widths and height may be the same for each transmit data signal upper contact and transmit data signal via contact of any other transmit data signal layers exist in row 184. Transmit data signal via contact 142 of level L1 (e.g., of the lowest transmit data signal via level of an interconnect stack) is formed over or onto transmit data signal trace 148 such that the via contact is directly attached (e.g., touching) and electrically coupled to transmit data signal trace 148. Trace 148 has height H4 and may have a width such as width W6. It can be appreciated that transmit data signal contacts 140 and 142; and trace 148 may have width and/or height less than or greater than those mentioned above.

FIGS. 2A-B show only stack 284 of rows 184-190. However, it can be appreciated that stack 284 can represent any one of rows 184-190. In some cases, stack 284 and FIGS. 2A-B is an example of all the rows 184-190 of FIGS. 1 and 3.

FIGS. 2A-B show pitch width PW between rows 170 and 172. It can be appreciated that the same pitch width may apply to each of adjacent rows of rows 172-190.

FIG. 2B shows dielectric portions 103a in layer 210 between any of (e.g., occupying space not occupied by) upper contacts 110, 120, 130, 140, traces, and webbing 160 of layer 210. It also shows dielectric portions 103b in layer 212 between any of via contacts 112, 122, 132, 142 and traces of layer 212. It also shows dielectric portions 103c in layer 220 between any of upper contacts 110, 120, 130, 140, traces, and webbing 162 of layer 220. It also shows dielectric portions 103d in layer 222 between any of via contacts 112, 122, 132, 142 and traces of layer 222. It also shows dielectric portions 103e in layer 230 between any of upper contacts 110, 120, 130, 140, traces, and webbing 164 of layer 230. It also shows dielectric portions 103f in layer 232 between any of via contacts 112, 122, 132, 142 and traces of layer 232. Dielectrics 103a, 103b, 103c, 103d, 103e, and 103f may be a dielectric as described for dielectric 103.

According to some embodiments, contacts 110, 120, 130 and 140; traces; dielectric layers or portions; and webbing 160 of level L1 may be described as "first level" power contacts 110, ground isolation contacts 120, data signal receive contacts 130 and data signal transmit contacts 140; traces; dielectric layers or portions; and webbing, respectively. For example, contact 120 of level L1 may be described as a "first level ground contact". Also, according to some embodiments, via contacts 112, 122, 132 and 142; traces; dielectric layers or portions; and webbing 162 of level L2 may be described as "second level" power via contacts 112, ground isolation via contacts 122, data signal receive via contacts 132 and data signal transmit via contacts 142; traces; dielectric layers or portions; and webbing, respectively. For example, via contact 122 of level L1 may be described as a "first level ground via contact". In some cases, these descriptions also repeat for level L2 (e.g., "second level . . . contacts"), level L3 ("third level . . . contacts"), level L4 (e.g., "fourth level . . . contacts"), and level L5 ("fifth level . . . contacts").

Figure 3A:
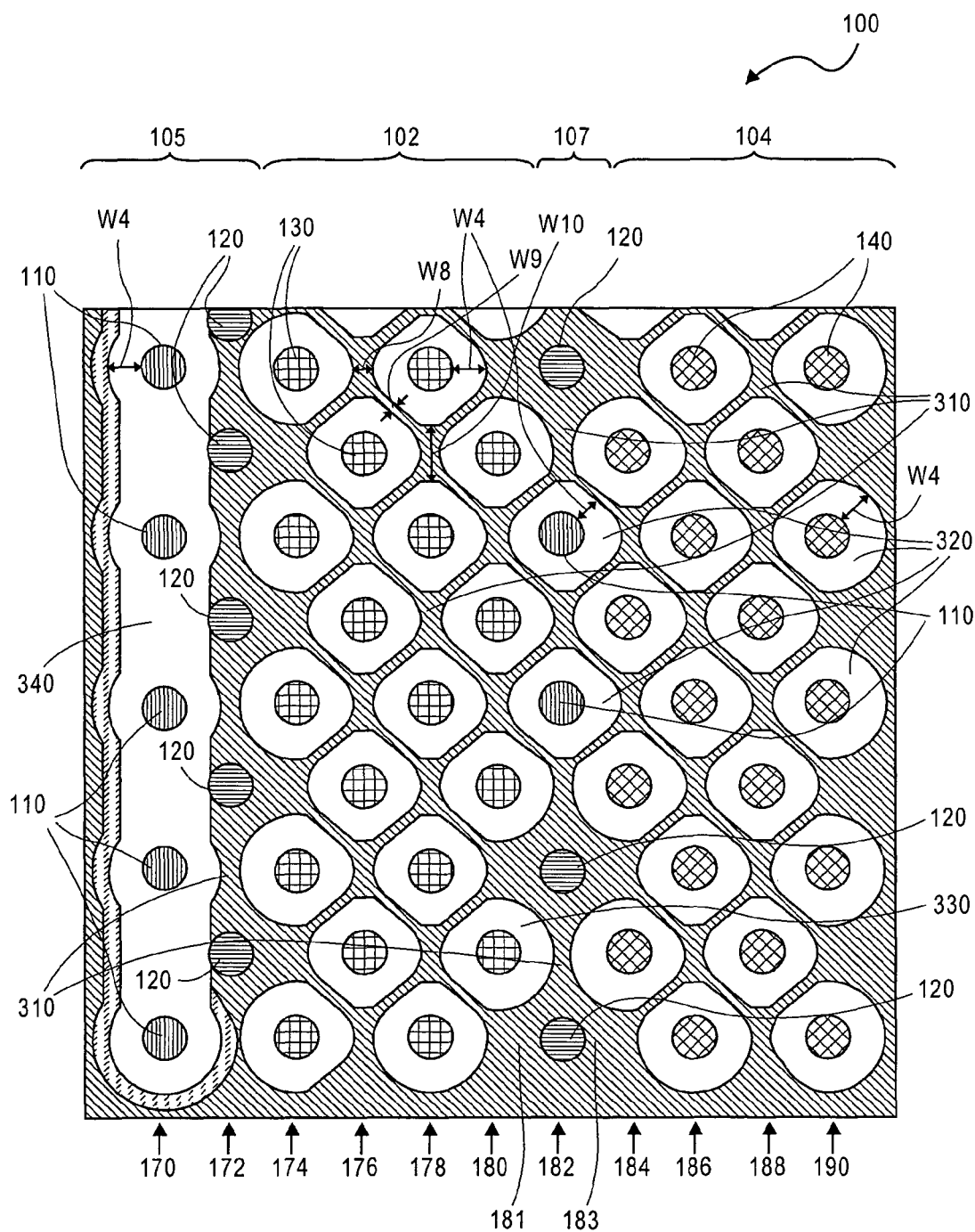
FIG. 3A is a schematic cross-sectional top view of the package of FIG. 1 showing top or upper layer contacts of a top interconnect level; and shading representing one or more layers of ground webbing structure of the package.

FIG. 3A is a schematic cross-sectional top view of the package of FIG. 1 showing top or upper layer contacts of a top or typical interconnect level; and shading representing one typical layer of ground webbing structure of the package. FIG. 3A shows package 100 having zone 102 with contacts 130 in rows 174-180. It shows zone 104 having contacts 140 in rows 184-190. It shows zone 105 having contacts 110 in row 170 and contacts 120 in row 172. It shows zone 107 having contacts 110 and 120 in row 182.

FIG. 3A shows shading 310 representing ground webbing structure 310 that may represent all or a portion of structures 160, 162 or 164 at levels L1, L2 or L3. FIG. 3A shows webbing structure 310 such as a layer of solid conductor material extending between any or all of (e.g., occupying space not occupied by) width W4 of dielectric portions 103a surrounding upper contacts 110, 130, 140, traces, and ties (e.g., in layer 210).

In some cases, ground webbing structures 160, 162, and 164 may be described as conductive ground webbing structures in die-bump fields or zones 102, 104, 105 and 107 to reduce bump field crosstalk, cluster-to-cluster crosstalk and in-cluster crosstalk of zones 102, 104, 105 and 107. This is described further below.

Row 170 shows locations 340 such as areas between contacts 110 and surrounding ground webbing structure 310 where no webbing exists. Examples of locations 340 are indicated by no shading color. For example, the brightest areas of FIG. 3A, around contacts 110 of row 170, do not have any ground webbing structure for a distance of W4 around each contact which is between the edge of a contact and the inner edge of all of the webbing structure 310. Here, webbing 310 surrounds contacts 110 in row 170 at a distance of width W4 (e.g., are width W4 away from the edges of contacts 110). In some cases, width W4 is approximately 12 micrometers. In some cases, it is between 10 and 20 micrometers (um). In some cases, it is between 8 and 30 micrometers. In some cases, it is between 12 and 50 micrometers.

Rows 172 and 182 show areas in rows 172 and 182 that have structure 310, such as where one of webbings 160, 162 or 164 exist. Examples of structure 310 are indicated by the shading.

Also, row 182 shows locations 320 such as an area between contacts 110 and surrounding ground webbing structure 310 or where no webbing exists. Examples of locations 320 are indicated by no shading color. For example, the brightest areas of FIG. 3A, around contacts 110 of row 182, do not have any ground webbing structure for a distance of W4 around each contact which is between the edge of a contact and the inner edge of all of the webbing structure 310. Here, webbing 310 surrounds contacts 110 in row 182 at a distance of width W4 (e.g., are width W4 away from the edges of contacts 110).

Zone 102 (e.g., rows 174-180) shows structure 310, such as where one of webbings 160, 162 or 164 exist. Examples of structure 310 are indicated by the shading. Zone 102 (e.g., rows 174-180) also show locations 330 such as an area between contacts 130 and surrounding ground webbing structure where no webbing exists. Examples of locations 330 are indicated by no shading color. For example, the brightest areas of FIG. 3A, around contacts 130 of rows 174-180, do not have any ground webbing structure for a distance of W4 around each contact which is between the edge of a contact and the inner edge of all of the webbing structure 310. Here, webbing 310 surrounds contacts 130 in rows 174-180 at a distance of width W4 (e.g., are width W4 away from the edges of contacts 130).

Zone 104 (e.g., rows 184-190) shows structure 310, such as where one of webbings 160, 162 or 164 exist. Zone 104 (e.g., rows 184-190) also shows locations 320 such as an area between contacts 140 and surrounding ground webbing structure where no webbing exists. Examples of locations 320 are indicated by no shading color. For example, the brightest areas of FIG. 3A, around contact's 140 of rows 184-190, do not have any ground webbing structure for a distance of W4 around each contact which is between the edge of a contact and the inner edge of all of the webbing structure 310. Here, webbing 310 surrounds contacts 140 in rows 184-190 at a distance of width W4 (e.g., are width W4 away from the edges of contacts 140).

FIG. 3A also shows width W8 of webbing structure 310 between side by side, adjacent contacts. W8 may represent a width of solid conductor material or webbing of webbing 310 (e.g., representing the same for webbing 160, 162 or 164) that is disposed between two side by side, adjacent contacts from a top perspective view (e.g., along pitch width PW), and that surrounds the contacts by distance W4. In some cases, width W8 is approximately 12 micrometers. In some cases, it is between 10 and 20 micrometers (um). In some cases, it is between 8 and 30 micrometers. In some cases, it is between 12 and 50 micrometers. Width W8 may exist for webbing 160, 162 and 164.

Next, FIG. 3A shows width W9 of webbing structure 310 between diagonally adjacent contacts. W9 may represent a width of solid conductor material or webbing of webbing 310 (e.g., representing the same for webbing 160, 162 or 164) that is disposed between two diagonally adjacent contacts (e.g., along diagonal pitch PD), and that surrounds the contacts by distance W4. In some cases, width W9 is approximately 12 micrometers. In some cases, it is between 10 and 20 micrometers (um). In some cases, it is between 8 and 30 micrometers. In some cases, it is between 12 and 50 micrometers. Width W9 may exist for webbing 160, 162 and 164.

Also, FIG. 3A shows width W10 of webbing structure 310 between upper and lower, adjacent contacts. W10 may represent a width of solid conductor material or webbing of webbing 310 (e.g., representing the same for webbing 160, 162 or 164) that is disposed between two upper and lower, adjacent contacts (e.g., along length pitch PL), and that surrounds the contacts by distance W4. In some cases, width W10 is approximately 75 micrometers. In some cases, it is between 60 and 90 micrometers (um). In some cases, it is between 50 and 110 micrometers. In some cases, it is between 40 and 130 micrometers. Width W10 may exist for webbing 160, 162 and 164.

FIGS. 2A-B show embodiments of ground webbing structures 160, 162, and 164 at levels L1, L2, and L3. FIG. 3A show embodiments of ground webbing structures 310 which may represent any or all of structures 160, 162, and 164 at levels L1, L2, and L3. FIGS. 2A-B show ground webbing layer 160 that may be formed along, or under top surface 106. Ground webbing 160 has height H5 and width W5. In some cases height H5 is equal to height H1. Ground webbing 160 may be an upper (e.g., top or first) layer of conductive material that is formed as part of, touching, and electrically coupled to upper ground contacts 120 of upper layer 210 of level L1. In some cases, webbing 160 is an upper layer of conductive material that is formed during the same deposition or plating used to form upper contacts 120 of level L1. In some cases, webbing 160 contacts many or most of the upper contacts 120 of level L1. In some cases, webbing 160 contacts all of upper contacts 120 of level L1. Webbing structure 160 may be a layer of solid conductor material extending between all of (e.g., occupying space not occupied by) width W4 of dielectric portions 103a surrounding upper contacts 110, 130, 140, and any traces of layer 210.

In some cases, height H5 may be approximately 15 micrometers (15×E-6 meter—"um") and width W5 is between 1 millimeter (mm) and 20 mm. In some cases, height H5 is between 10 and 20 micrometers (um). In some cases, it is between 5 and 30 micrometers. In some cases, width W5 can span an entire width of a die or chip.

For example, ground isolation webbing structure 160 is shown by the dashed lines (e.g., "-----") in upper layer 210 of level L1 of FIG. 2A; by the shaded height H5 in FIG. 2B; and by shading of webbing structure 310 in FIG. 3A. Structure 160 is an upper (e.g., top, topmost or first) level L1 (or layer 210) ground webbing structure. In some cases, webbing structure 160 is formed (e.g., disposed) having top surfaces that are part of or horizontally planar with surface 106, such as by being formed with or as part of layer 210 having conductor (1) that includes contacts 110, 120, 130 and 140 of level L1; and (2) between which dielectric 103 of layer 210 exists (having top surface 106). In some cases, webbing structure 160 is formed (e.g., disposed) above top surface 106, such as where the layer of conductor is formed on or over a layer of dielectric or other material. In some cases, webbing structure 160 is formed (e.g., disposed) under top surface 106, such as when a further layer of dielectric, solder resist, or other material is formed on level L1, over webbing 160.

FIGS. 2A-B show ground webbing layer 162 formed along an upper surface of dielectric upon which upper contacts of level L2 are formed. Ground webbing 162 has height H5 and width W5. Ground webbing 162 may be an upper (e.g., top or first) layer of conductive material that is formed as part of, touching, and electrically coupled to upper ground contacts 120 of upper layer 220 of level L2. In some cases, webbing 162 is an upper layer of conductive material that is formed during the same deposition or plating used to form upper contacts 120 of level L2. In some cases, webbing 162 contacts many or most of the upper contacts 120 of level L2. In some cases, webbing 160 contacts all of upper contacts 120 of level L2. Webbing structure 162 may be a layer of solid conductor material extending between all of (e.g., occupying space not occupied by) width W4 of dielectric portions 103a surrounding any of upper contacts 110, 130, 140, and traces 148 of layer 220.

For example, ground isolation webbing structure 162 is shown by the dashed lines (e.g., "-----") in upper layer 220 of level L2 of FIG. 2A; by the shaded height H5 in FIG. 2B; and by shading of webbing structure 310 in FIG. 3A. Structure 162 is a second or secondmost level L2 (or layer 220) ground webbing structure. In some cases, webbing structure 162 is formed (e.g., disposed) having top surfaces that are part of or horizontally planar with a top surface of level L2, such as by being formed with or as part of layer 220 having conductor (1) that includes upper contacts 110, 120, 130 and trace 148 of level L2; and (2) between which dielectric 103 of layer 220 exists. In some cases, webbing structure 162 is formed (e.g., disposed) under top surface 106, by height H2, such as due to having level L1 formed over webbing 162.

FIGS. 2A-B show ground webbing layer 164 formed along an upper surface of dielectric upon which upper contacts of level L3 are formed. Ground webbing 164 has height H5 and width W5. Ground webbing 164 may be an upper (e.g., top or first) layer of conductive material that is formed as part of, touching, and electrically coupled to upper ground contacts 120 of upper layer 230 of level L3. In some cases, webbing 164 is an upper layer of conductive material that is formed during the same deposition or plating used to form upper contacts 120 of level L3. In some cases, webbing 164 contacts many or most of the upper contacts 120 of level L3. In some cases, webbing 164 contacts all of upper contacts 120 of level L3. Webbing structure 164 may be a layer of solid conductor material extending between all of (e.g., occupying space not occupied by) width W4 of dielectric portions 103a surrounding any of upper contacts 110, 130, 140, and traces 128 of layer 230.

For example, ground isolation webbing structure 164 is shown by the dashed lines (e.g., "-----") in upper layer 230 of level L3 of FIG. 2A; by the shaded height H5 in FIG. 2B; and by shading of webbing structure 310 in FIG. 3A. Structure 164 is a third or thirdmost level L3 (or layer 230) ground webbing structure. In some cases, webbing structure 164 is formed (e.g., disposed) having top surfaces that are part of or horizontally planar with a top surface of level L3, such as by being formed with or as part of layer 230 having conductor (1) that includes upper contacts 110, 120, 130 and trace 128 of level L3; and (2) between which dielectric 103 of layer 230 exists. In some cases, webbing structure 164 is formed (e.g., disposed) under top surface 106, by height (2×H2 plus 2×H1), such as due to having levels L1 and L2 formed over webbing 164.

Figure 3B:
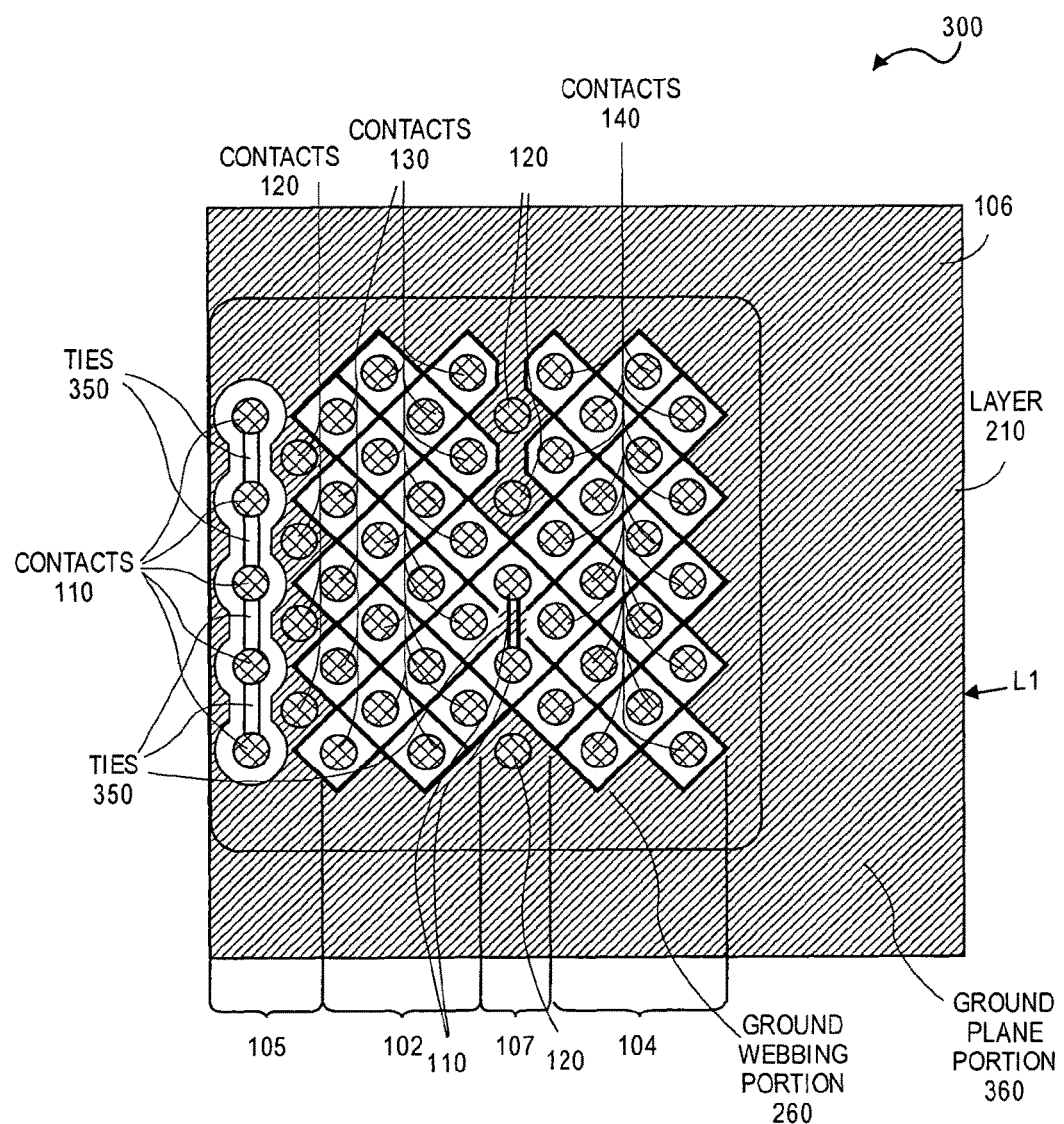
FIG. 3B is a schematic cross-sectional top view of a ground webbing structure package showing top or upper layer ground webbing structure portion 260 of a top interconnect level of the package.

FIG. 3B is a schematic cross-sectional top view of a ground webbing structure package showing top or upper layer ground webbing structure portion 260 of a top interconnect level of the package. In some cases, package 300 is package 100, such as by having zones 102, 104, 105 and 107 at levels L1-L6. In some cases it is a package similar to package 100 except that the ground webbing structures 160, 162 and 164 are described as ground webbing portions 260, 262 and 264, respectively. In some cases it is a package similar to package 100 except that the ground webbing structures 160, 162 and 164 are described as the combination of ground webbing portion 260 and plane 360; ground webbing portion 262 and plane 362; and ground webbing portion 264 and plane 364, respectively.

FIG. 3B may be a top perspective view of layer 210 of device 300. It shows layer 210 having power contacts 110, ground contacts 120, received signal contacts 130, transmit signal contacts 140, ground webbing portion 260, and ground plane portion 360. FIG. 3B also shows layer 210 having zone 102 with contacts 130 in rows 174-180. It shows zone 104 having contacts 140 in rows 184-190. It shows zone 105 having contacts 110 in row 170 and contacts 120 in row 172. It shows zone 107 having contacts 110 and 120 in row 182. It shows layer 210 having ground webbing portion 260 directly attached to and electrically coupled to contacts 120 of layer 210. It shows layer 210 having ground plane portion 360 directly attached to (e.g., formed with) and electrically coupled to webbing portion 260. In some cases, contacts 110 of layer 210 in zones 105 and 107 are tied together in layer 210 by power signal ties 350 (e.g., conductor material, such as metal or copper, ties directly attached to and extending between adjacent ones of contacts 110) as shown. Webbing portion 260 may be a layer of solid conductor material extending between all of (e.g., occupying space not occupied by) a width of dielectric material surrounding upper contacts 110, 130, 140, and any ties of layer 210. Plane portion 360 may be a layer of solid conductor material extending around and physically attached to (e.g., formed with or as part of) portion 260.

In some cases, portion 260 may be the same as webbing 160 (e.g., the same device, formed the same way and having the same function and capabilities as webbing 160). In some cases, the combination of portion 260 and portion 360 may be the same as webbing 160. In some cases, the descriptions for webbing 160 describe portion 260; and portion 360 is a ground plane that has inner edges formed with, extending from, directly attached to, and electrically coupled to (e.g., with zero resistance) the outer edges of portion 260. In FIG. 3B, portion 260 may exist in all of zones 102, 104, 105 and 107. In some cases, portion 260 may cover an area equal to at least width (WE2+2WE1+WE3)×length LE1.

FIG. 3B shows all of the openings in webbing portion 260 of zone 102 having contacts 130. However, it can be appreciated that fewer than all, such as half (or one third or two thirds) of all of the openings in webbing portion 260 of zone 102 may have contacts 130. Also, it can be appreciated that in some embodiments, webbing portion 260 may only extends across half of zone 102 (e.g., across only half of width WE1 of zone 102) and in this case only half of all of the openings shown in webbing portion 260 of zone 102 have contacts 130 (not shown, but accomplished by removing half of width WE1 of webbing portion 260 and contacts 130 with ground plane portion 360 in zone 102).

FIG. 3B also shows all of the openings in webbing portion 260 of zone 104 having contacts 140. However, it can be appreciated that fewer than all, such as half (or one third or two thirds) of all of the openings in webbing portion 260 of zone 104 may have contacts 140. Also, it can be appreciated that in some embodiments, webbing portion 260 may only extends across half of zone 104 (e.g., across only half of width WE1 of zone 104) and in this case only half of all of the openings shown in webbing portion 260 of zone 104 have contacts 140 (not shown, but accomplished by removing half of width WE1 of webbing portion 260 and contacts 140 with ground plane portion 360 in zone 104).

Figure 3C:
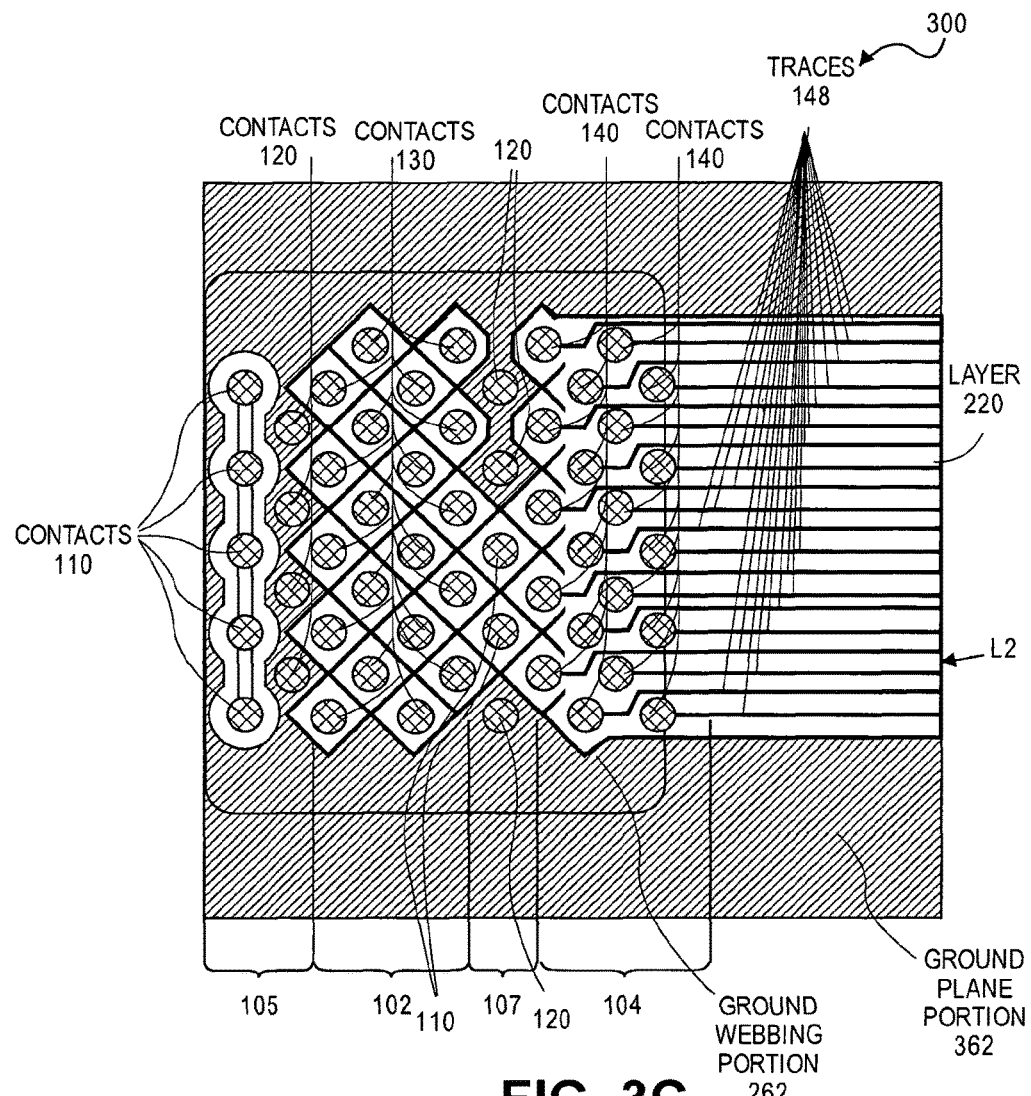
FIG. 3C is a schematic cross-sectional top view of a ground webbing structure package showing top layer or upper layer ground webbing structure portion 262 of a second interconnect level of the package.

FIG. 3C is a schematic cross-sectional top view of a ground webbing structure package showing top layer or upper layer ground webbing structure portion 262 of a second interconnect level of the package. FIG. 3C may be a top perspective view of layer 220 of device 300. In some cases, layer 210 of FIG. 3B is formed upon or onto layer 212 (e.g., see FIGS. 2A-B) which is formed upon or onto layer 220 of FIG. 3C. FIG. 3C shows layer 220 having power contacts 110, ground contacts 120, received signal contacts 130, transmit signal contacts 140, ground webbing portion 262, ground plane portion 362, and signal traces 148 which may be directly attached to and electrically coupled to contacts 140 of layer 220. Webbing portion 262 may be a layer of solid conductor material extending between all of (e.g., occupying space not occupied by) a width of dielectric material surrounding upper contacts 110, 130 and any traces and ties of layer 220. Plane portion 362 may be a layer of solid conductor material extending around and physically attached to (e.g., formed with or as part of) portion 262.

FIG. 3C also shows layer 220 having zone 102 with contacts 130 in rows 174-180. It shows zone 104 having contacts 140 in rows 184-190. It shows zone 105 having contacts 110 in row 170 and contacts 120 in row 172. It shows zone 107 having contacts 110 and 120 in row 182. It shows layer 220 having ground webbing portion 262 directly attached to and electrically coupled to contacts 120 of layer 220. It shows layer 220 having ground plane portion 362 directly attached to (e.g., formed with) and electrically coupled to webbing portion 262. In some cases, contacts 110 of layer 220 in zone 105 (and optionally zone 107, now shown but removing portion 262 from between those two contacts 110 such as shown in FIG. 3B) are tied together in layer 220 by power signal ties (e.g., conductor material, such as metal, ties directly attached to and extending between adjacent ones of contacts 110) as shown.

In some cases, portion 262 may be the same as webbing 162 (e.g., the same device, formed the same way and having the same function and capabilities as webbing 162). In some cases, the combination of portion 262 and portion 362 may be the same as webbing 162. In some cases, the descriptions for webbing 162 describe portion 262; and portion 362 is a ground plane that has inner edges formed with, extending from, directly attached to, and electrically coupled to (e.g., with zero resistance) the outer edges of portion 262. In FIG. 3C, portion 262 may exist in all of zones 102, 105 and 107 (but not in zone 104). In some cases, portion 262 may cover an area equal to at least width (WE2+WE1+WE3)×length LE1.

FIG. 3C shows all of the openings in webbing portion 262 of zone 102 having contacts 130. However, it can be appreciated that fewer than all, such as half (or one third or two thirds) of all of the openings in webbing portion 262 of zone 102 may have contacts 130. Also, it can be appreciated that in some embodiments, webbing portion 262 may only extends across half of zone 102 (e.g., across only half of width WE1 of zone 102) and in this case only half of all of the openings shown in webbing portion 262 of zone 102 have contacts 130 (not shown, but accomplished by removing half of width WE1 of webbing portion 262 and contacts 130 with ground plane portion 362 in zone 102).

FIG. 3C shows all of zone 104 having contacts 140. However, it can be appreciated that fewer than all, such as half (or one third or two thirds) of all of zone 104 may have contacts 140. Also, it can be appreciated that in some embodiments, zone 104 only extends across half of shown zone 104 (e.g., across only half of width WE1 of zone 104) and in this case only half of all of shown zone 104 has contacts 140 (not shown, but accomplished by replacing half of width WE1 of contacts 140 with ground plane portion 362 in zone 104).

Figure 3D:
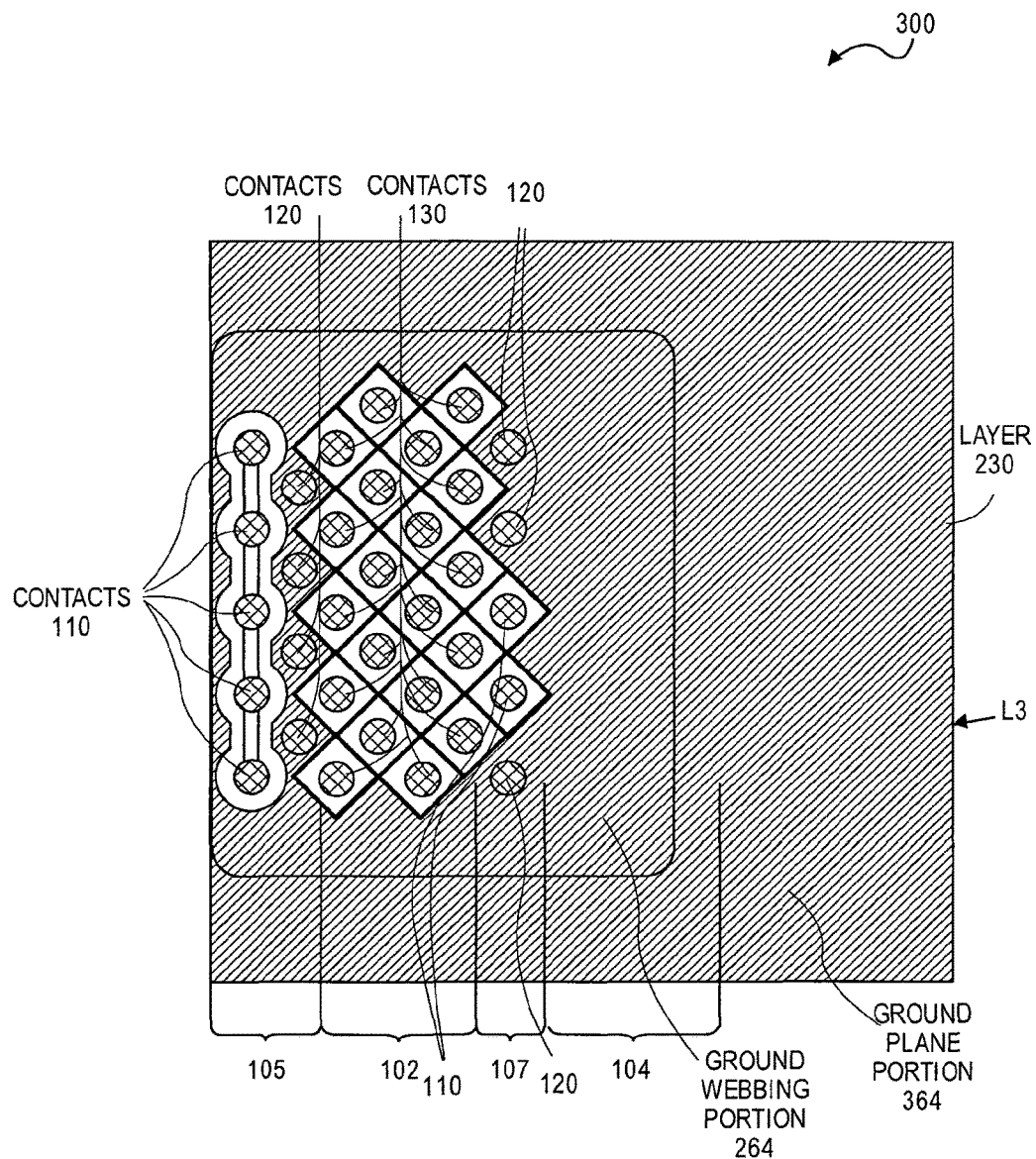
FIG. 3D is a schematic cross-sectional top view of a ground webbing structure package showing top layer or upper layer ground webbing structure portion 264 of a third interconnect level of the package.

FIG. 3D is a schematic cross-sectional top view of a ground webbing structure package showing top layer or upper layer ground webbing structure portion 264 of a third interconnect level of the package. FIG. 3D may be a top perspective view of layer 230 of device 300. In some cases, layer 220 of FIG. 3C is formed upon or onto layer 222 (e.g., see FIGS. 2A-B) which is formed upon or onto layer 230 of FIG. 3D. FIG. 3D shows layer 230 having power contacts 110, ground contacts 120, transmit signal contacts 140, ground webbing portion 264, and ground plane portion 364. Webbing portion 264 may be a layer of solid conductor material extending between all of (e.g., occupying space not occupied by) a width of dielectric material surrounding upper contacts 110, 130, and any ties of layer 230. Plane portion 364 may be a layer of solid conductor material extending around and physically attached to (e.g., formed with or as part of) portion 264.

FIG. 3D also shows layer 230 having zone 102 with contacts 130 in rows 174-180. It shows zone 104 having ground plane portion 364 in rows 184-190. It shows zone 105 having contacts 110 in row 170 and contacts 120 in row 172. It shows zone 107 having contacts 110 and 120 in row 182. It shows layer 230 having ground webbing portion 264 directly attached to and electrically coupled to contacts 120 of layer 230. It shows layer 230 having ground plane portion 364 directly attached to (e.g., formed with) and electrically coupled to webbing portion 264. In some cases, contacts 110 of layer 230 in zone 105 (and optionally zone 107, now shown but removing portion 264 from between those two contacts 110 such as shown in FIG. 3B) are tied together in layer 230 by power signal ties (e.g., conductor material, such as metal, ties directly attached to and extending between adjacent ones of contacts 110) as shown.

In some cases, portion 264 may be the same as webbing 164 (e.g., the same device, formed the same way and having the same function and capabilities as webbing 164). In some cases, the combination of portion 264 and portion 364 may be the same as webbing 164. In some cases, the descriptions for webbing 164 describe portion 264; and portion 364 is a ground plane that has inner edges formed with, extending from, directly attached to, and electrically coupled to (e.g., with zero resistance) the outer edges of portion 264. In FIG. 3D, portion 264 may exist only in of zones 102, 105 and 107 (e.g., but not in zone 104 where ground plane portion 364 exists). In some cases, portion 264 may cover an area equal to at least width (WE2+WE1+WE3)×length LE1.

FIG. 3D shows all of the openings in webbing portion 264 of zone 102 having contacts 130. However, it can be appreciated that fewer than all, such as half (or one third or two thirds) of all of the openings in webbing portion 264 of zone 102 may have contacts 130. Also, it can be appreciated that in some embodiments, webbing portion 264 may only extends across half of zone 102 (e.g., across only half of width WE1 of zone 102) and in this case only half of all of the openings shown in webbing portion 264 of zone 102 have contacts 130 (not shown, but accomplished by removing half of width WE1 of webbing portion 264 and contacts 130 with ground plane portion 364 in zone 102).

Figure 3E:
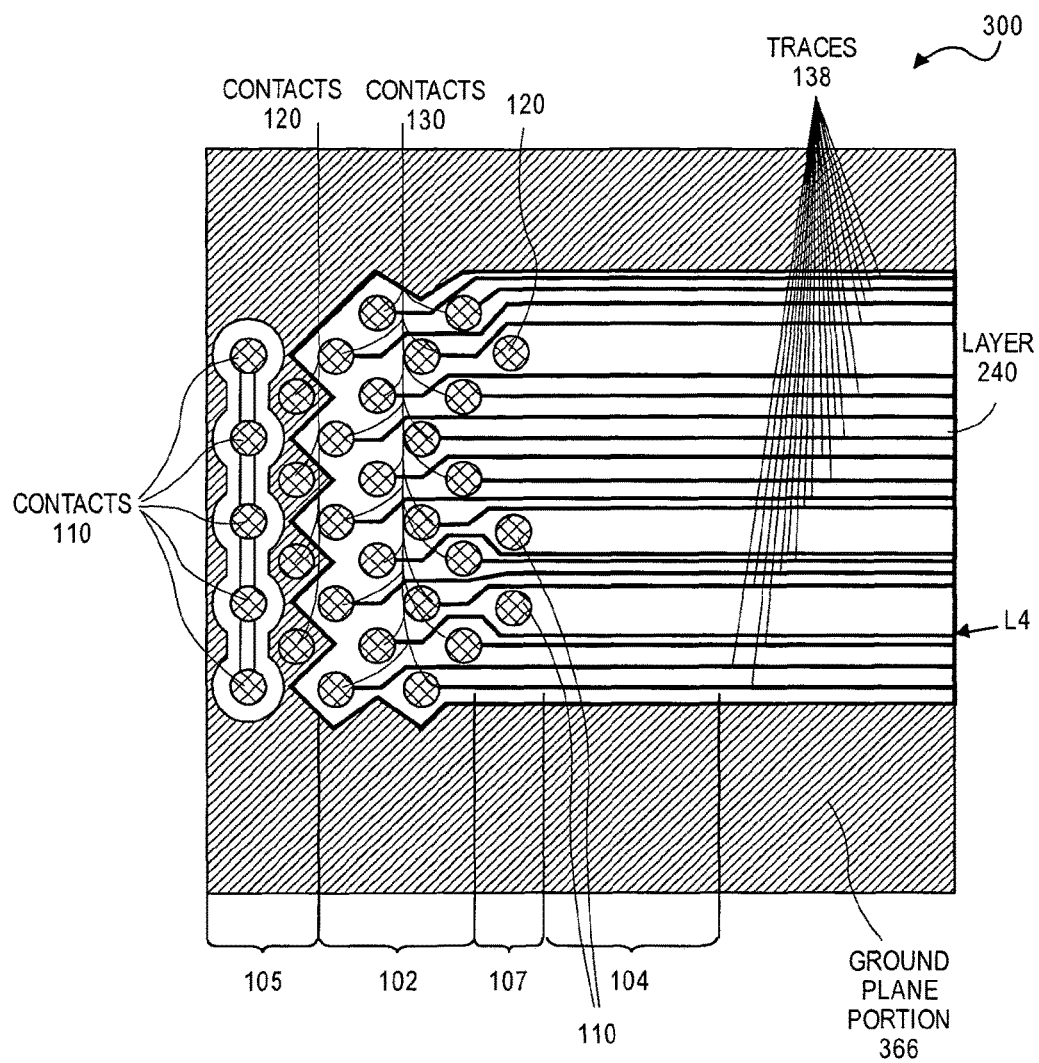
FIG. 3E is a schematic cross-sectional top view of a ground webbing structure 20, package showing top layer or upper layer ground webbing structure portion 266 of a fourth interconnect level of the package.

FIG. 3E is a schematic cross-sectional top view of a ground webbing structure package showing top layer or upper layer ground plane portion 366 of a fourth interconnect level of the package. FIG. 3E may be a top perspective view of layer 240 of device 300. In some cases, layer 230 of FIG. 3D is formed upon or onto layer 232 (e.g., see FIGS. 2A-B) which is formed upon or onto layer 240 of FIG. 3E. FIG. 3E shows layer 240 having power contacts 110, ground contacts 120, received signal contacts 130, ground plane portion 366, and signal traces 138 which may be directly attached to and electrically coupled to contacts 130 of layer 240. Plane portion 366 may be a layer of solid conductor material extending around and physically surrounding a width of dielectric material surrounding upper contacts 110, 130, and any ties and traces of layer 240.

FIG. 3E also shows layer 240 having zone 102 with contacts 130 in rows 174-180. It shows zone 104 having signal traces 138 in rows 184-190. It shows zone 105 having contacts 110 in row 170 and contacts 120 in row 172. It shows zone 107 having contacts 110 and 120 in row 182. It shows layer 240 having portion 366 directly attached to and electrically coupled to contacts 120 of layer 240. In some cases, contacts 110 of layer 240 in zone 105 (but not zone 107) are tied together in layer 240 by power signal ties (e.g., conductor material, such as metal, ties directly attached to and extending between adjacent ones of contacts 110) as shown. In some cases, portion 366 is a ground plane that has inner edges formed with, extending from, directly attached to, and electrically coupled to (e.g., with zero resistance) the outer edges of contacts 120 of zone 102. In FIG. 3E, portion 366 may exist in all of zone 105.

FIG. 3E shows all of zone 102 having contacts 130. However, it can be appreciated that fewer than all, such as half (or one third or two thirds) of all of zone 102 may have contacts 130. Also, it can be appreciated that in some embodiments, zone 102 only extends across half of shown zone 102 (e.g., across only half of width WE1 of zone 102) and in this case only half of all of shown zone 102 has contacts 130 (not shown, but accomplished by replacing half of width WE1 of contacts 130 with ground plane portion 366 in zone 102).

Figure 3F:
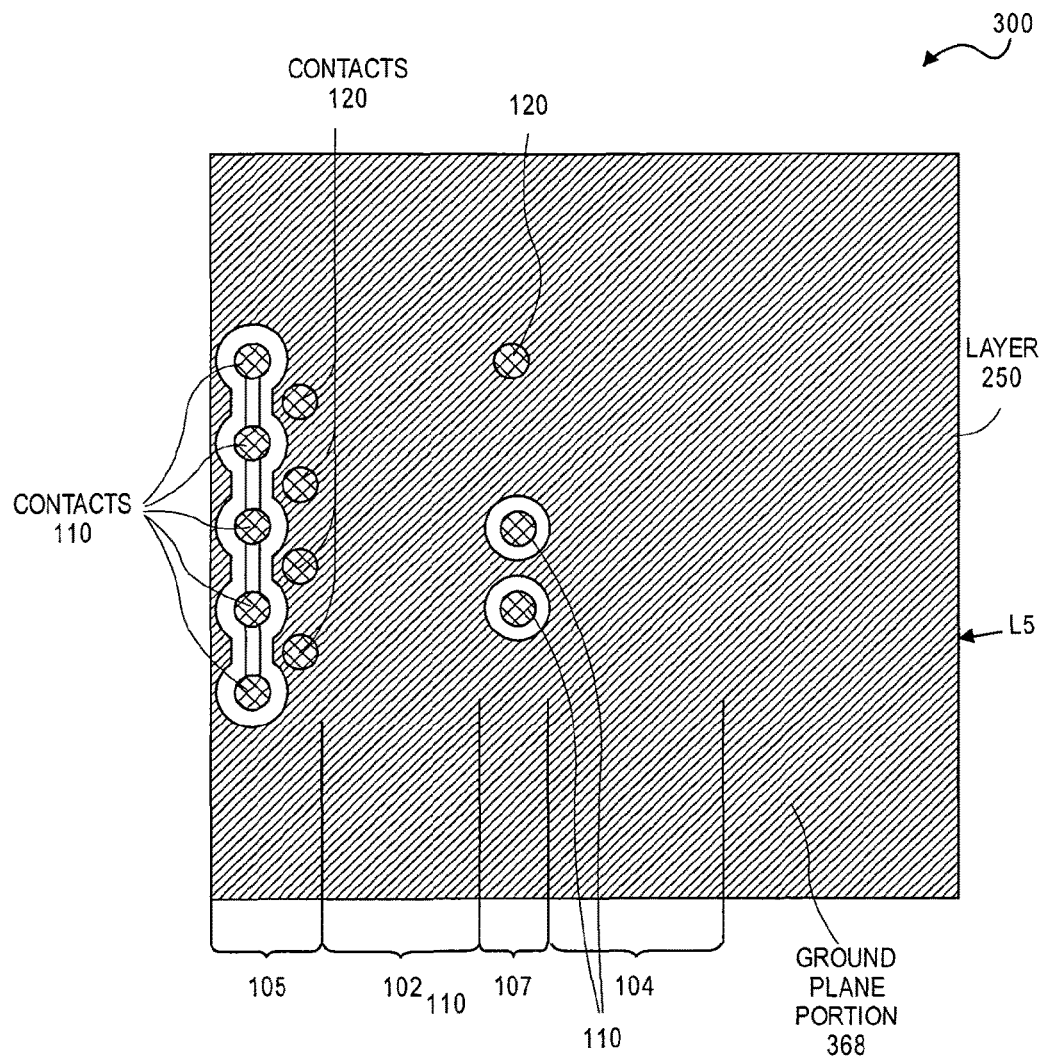
FIG. 3F is a schematic cross-sectional top view of a ground webbing structure package showing top layer or upper layer ground plane portion 368 of a fifth interconnect level of the package.

FIG. 3F is a schematic cross-sectional top view of a ground webbing structure package showing top layer or upper layer ground plane portion 368 of a fifth interconnect level of the package. FIG. 3F may be a top perspective view of layer 250 of device 300. In some cases, layer 240 of FIG. 3E is formed upon or onto layer 242 (e.g., see FIGS. 2A-B) which is formed upon or onto layer 250 of FIG. 3F. FIG. 3F shows layer 250 having power contacts 110, ground contacts 120 and ground plane portion 368. Plane portion 368 may be a layer of solid conductor material extending around and physically surrounding a width of dielectric material surrounding upper contacts 110 and any ties and traces of layer 250.

FIG. 3F also shows layer 250 having zone 102 with ground plane portion 368 in rows 174-180. It shows zone 104 having ground plane portion 368 in rows 184-190. It shows zone 105 having contacts 110 in row 170 and contacts 120 in row 172. It shows zone 107 having contacts 110 and 120 in row 182. It shows layer 250 having ground plane portion 368 directly attached to (e.g., formed with) and electrically coupled to contacts 120. In some cases, contacts 110 of layer 250 are tied together in layer 250 in zone 105 (and optionally zone 107, now shown but removing portion 368 from between those two contacts 110 such as shown in FIG. 3B) by power signal ties (e.g., conductor material, such as metal, ties directly attached to and extending between adjacent ones of contacts 110) as shown.

In some cases, portion 368 is a ground plane that has inner edges formed with, extending from, directly attached to, and electrically coupled to (e.g., with zero resistance) the outer edges of contacts 120. In some cases, portion 368 represents the ground traces 128 of level L5 as shown in FIGS. 1-2B.

Figure 3G:
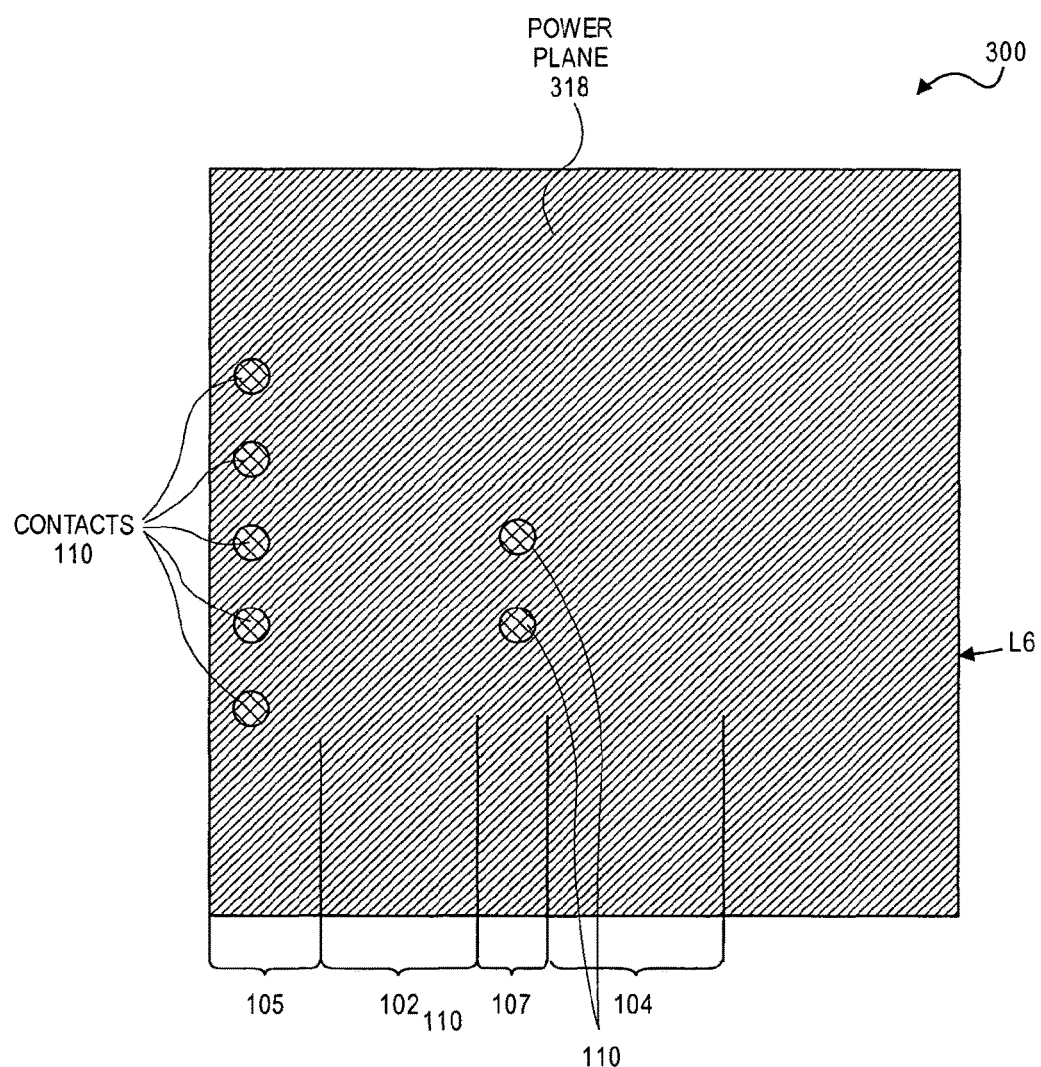
FIG. 3G is a schematic cross-sectional top view of a ground webbing structure package showing top layer or upper layer power traces (or plane) layer of a sixth interconnect level of the package.

FIG. 3G is a schematic cross-sectional top view of a ground webbing structure package showing top layer or upper layer power plane layer of a sixth interconnect level of the package. FIG. 3G may be a top perspective view of a layer having power plane 318 which may be directly attached to and electrically coupled to contacts 110 of that layer. In some cases, layer 250 of FIG. 3F is formed upon or onto layer 252 (e.g., see FIGS. 2A-B) which is formed upon or onto the layer of FIG. 3G. FIG. 3F shows a layer having power contacts 110 of the tied together in that layer by power plane 318 (e.g., conductor material (such as a metal) plane or layer directly attached to and extending between adjacent ones of contacts 110 as shown. Plane 318 may be a layer of solid conductor material extending around and physically attached to (e.g., formed with) upper contacts 130 and any ties and traces of that layer.

FIG. 3G also shows a layer having zone 102 with power plane 318 in rows 170-190. It shows power plane 318 directly attached to (e.g., formed with) and electrically coupled to contacts 110. In some cases, plane 318 is a power plane that has inner edges formed with, extending from, directly attached to, and electrically coupled to (e.g., with zero resistance) the outer edges of contacts 110. In some cases, power plane 318 represents power traces 118 of level L6 as shown in FIGS. 1-2B.

Webbing structures 160, 162 and 164 are each electronically coupled to (e.g., touching, formed with, or directly attached to) ground contacts 120 of rows 172 and 182 of levels L1, L2 and L3, respectively. They also each surround the data signal contacts (e.g., any existing contacts 130 and 140 by distance W4) of levels L1, L2 and L3, respectively. It may also surround the power contacts 110 of levels L1, L2 and L3, respectively. The power contacts may be disposed adjacent to the ground contacts 120 in a power and ground zone (e.g., 105 or 107) that is between the data transmit signal zone 104 and the data receive signal zone 102 of levels L1, L2 and L3. In some cases, webbing structures 160, 162 and 164 each extend from the ground contacts 120 of levels L1, L2 and L3, respectively (1) through a first side 183 of the power and ground zone (e.g., zone 105 or 107) and into the data transmit signal zone 104 and surrounds the data transmit signal contacts 140 of levels L1, L2 and L3, respectively; and (2) through an opposite side 181 (e.g., opposite from the first side) of the power and ground zone and into the data receive signal zone 102 and surrounds the data receive signal contacts 130 of levels L1, L2 and L3, respectively. In some cases, ground webbing structures 160, 162 and 164 each extend along the same planar surface as the upper contacts (e.g., contacts 110, 120, 130 and 140) of levels L1, L2 and L3, respectively.

In some cases, contacts 110, 112 and traces 118 are used to transmit or provide power signals to an IC chip or other device attached to contacts 110 of Level L1. In some cases they are used to provide an alternating current (AC) or a direct current (DC) power signal (e.g., Vdd). In some cases the signal has a voltage of between 0.5 and 2.0 volts. In some cases it is a different voltage level.

In some cases, contacts 120, 122 and traces 128 are used to transmit or provide grounding (e.g., isolation) signals to an IC chip or other device attached to contacts 120 of Level L1. In some cases they are used to provide a zero voltage direct current (DC) grounding signal (e.g., GND). In some cases the signal has a voltage of between 0.0 and 0.2 volts. In some cases it is a different but grounding voltage level.

In some cases, contacts 130, 132 and traces 138 are used to transmit or provide a receive data signal from an IC chip or other device attached to contacts 130 of Level L1. In some cases they are used to provide an alternating current (AC) or high frequency (HF) receive data signal (e.g., RX). In some cases the signal has a frequency of between 7 and 25 GT/s; and a voltage of between 0.5 and 2.0 volts. In some cases the signal has a frequency of between 6 and 15 GT. In some cases the signal has a voltage of between 0.4 and 5.0 volts. In some cases it is a different frequency and/or voltage level.

In some cases, contacts 140, 142 and traces 148 are used to transmit or provide a transmit data signal to an IC chip or other device attached to contacts 140 of Level L1. In some cases they are used to provide an alternating current (AC) or high frequency (HF) transmit data signal (e.g., TRX). In some cases the signal has a frequency of between 7 and 25 GT/s; and a voltage of between 0.5 and 2.0 volts. In some cases the signal has a frequency of between 6 and 15 GT. In some cases the signal has a voltage of between 0.4 and 5.0 volts. In some cases it is a different frequency and/or voltage level.

Webbing structures 160, 162 and 164 may each provide a ground isolation webbing structure across all of zones 102, 104, 105 and 107 of levels L1, L2 and L3, respectively, that reduces "die bump field" crosstalk between all adjacent ones of contacts 110, 120, 130 and/or 140 surrounded by webbings 160, 162 and 164 of levels L1, L2 and L3, respectively. They may also each provide a ground isolation webbing structure between each of zones 102, 104, 105 and 107 of levels L1, L2 and L3, respectively, that reduces "cluster to cluster" crosstalk between all adjacent ones of zones 102, 104, 105 and 107 surrounded by webbings 160, 162 and 164 of levels L1, L2 and L3, respectively.

They may also each provide a ground isolation webbing structure within each of zones 102, 104, 105 and 107 of levels L1, L2 and L3, respectively, that reduces "in-cluster" crosstalk between all adjacent ones of contacts 110, 120, 130 or 140 in each of one 102, 104, 105 or 107 surrounded by webbings 160, 162 and 164 of levels L1, L2 and L3, respectively.

For example, by being layers of conductive material electrically connected to the ground contacts 120, ground isolation webbings 160, 162 and 164 may provide electrically grounded layers having openings through which contacts 110, 130, and 140 exist or are disposed. In some cases, webbings 160, 162 and 164 absorb, or shield electromagnetic crosstalk signals produced by one contact, from reaching an adjacent contact of levels L1, L2 and L3, respectively, due to the amount of grounded conductive material, and location of the conductive grounded material adjacent to (e.g., surrounding at a distance of W4) the power contacts 110, receive contacts 130, and transmit contacts 140 of levels L1, L2 and L3, respectively.

In some cases, any of ground isolation webbings 160, 162 or 164 reduce electrical crosstalk caused by undesired capacitive, inductive, or conductive coupling of a first signal received or transmitted through one of contacts 110, 130, and 140 effecting or being mirrored in a second signal received or transmitted through another, different one of contacts 110, 130, and 140 on the game level of levels L1-L5. In some cases, they reduce such electrical crosstalk of a first signal received or transmitted through one of contacts 130, and 140 effecting or being mirrored in a second signal received or transmitted through another, different one of contacts 130, and 140 on the same level of levels L1-L5. In some cases, they reduce such electrical crosstalk of such a first signal effecting or being mirrored in such a second signal on a different level of levels L1-L5, such as effecting or being mirrored in a second signal of an adjacent level (e.g., level L1 and L3 are adjacent to level L2). In some cases, each (or all) of ground isolation webbings 160, 162 and 164 reduce such electrical crosstalk from such a first signal effecting or being mirrored in such a second signal. In some cases, any or each of ground isolation webbings 160, 162 and 164 also reduce such electrical crosstalk from such a first signal received or transmitted through one of contacts 112, 132, and 142 effecting or being mirrored in such a second signal received or transmitted through another, different one of contacts 112, 132, and 142 on the same or different level of levels L1-L5 as noted above for contacts 110, 130, and 140.

Such electrical crosstalk may include interference caused by two signals becoming partially superimposed on each other due to electromagnetic (inductive) or electrostatic (capacitive) coupling between the contacts (e.g., conductive material) carrying the signals. Such electrical crosstalk may include where the magnetic field from changing current flow of a first data signal in one contact of contacts 130, 132, 140 or 142 (or trace 138 or 148) in levels L1-L5 as noted above induces current in a second data signal in one contact of contacts 130, 132, 140 or 142 (or trace 138 or 148) in levels L1-L5. The first and second signals may be flowing in contacts or traces running parallel to each other, as in a transformer.

In some embodiments, any or each of ground isolation webbings 160, 162 or 164 reduce electrical crosstalk as noted above (1) without increasing the distance or spacing between the contacts (or traces) noted above, (2) without increasing the distance or spacing between the any of Levels L1-L5, (3) without re-ordering any of the contacts (or traces) noted above or Levels L1-L5. In some cases, this is due to using any or each of ground isolation webbings 160, 162 or 164 as shielding between any of the contacts (or traces) noted above or Levels L1-L5.

In some embodiments, level L4 will not have any ground webbing. In some embodiments, level L5 will include a solid ground plane or layer (e.g., such as replacing trace 128). In some embodiments, level L6, below level L5 will be a solid planar ground layer (e.g., electrically coupled to grounding interconnects of rows 172 and/or 182). In some embodiments, level L2 or L3 will only have ground webbing 162 and 164 in zone 102 or 104. In some embodiments, level L2 or L3 will have no ground webbing 162 and 164 (e.g., only webbing 160 exists). In some embodiments, only level L1 and L3 will have ground webbing 160 and 164. In some embodiments, they will only have it in zones 102 and 103.

In some cases, a solder resist layer is formed over level L1. Such a resist may be a height (e.g., thickness) of solid non-conductive solder resist material. Such material may be or include an epoxy, an ink, a resin material, a dry resist material, a fiber base material, a glass fiber base material, a cyanate resin and/or a prepolymer thereof; an epoxy resin, a phenoxy resin, an imidazole compound, an arylalkylene type epoxy resin or the like as known for such a solder resist. In some cases it is an epoxy or a resin.

The resist may be a blanket layer that is masked and etched to form openings where solder can be formed on and attached to the upper contacts (e.g., contacts 110, 120, 130 and 140), or where contacts of anther device (e.g., a chip) can be soldered to the upper contacts. Alternatively, the resist may be a layer that is formed on a mask, and the mask then removed to form the openings. In some cases, the resist may be a material (e.g., epoxy) liquid that is silkscreened through or sprayed onto a pattern (e.g., mask) formed on the package; and the mask then removed (e.g., dissolved or burned) to form the openings. In some cases, the resist may be a liquid photoimageable solder mask (LPSM) ink or a dry film photoimageable solder mask (DFSM) blanket layer sprayed onto the package; and then masked and exposed to a pattern and developed to form the openings. In some cases, the resist goes through a thermal cure of some type after the openings (e.g., pattern) are defined. In some cases the resist is laser scribed to form the openings. In some cases, the resist may be formed by a process known to form such a resist of a package.

In some embodiments, features of level L1-L5 (e.g., contacts, via contacts and ground webbing) may have a pitch (e.g., such as defined as PW, PL, PD; and/or as an average of the height of contacts or layers) that is determined by a standard package design rule (DR) or chip package as known. In some cases, that pitch is a line spacing (e.g., the actual value of the line widths and spaces between lines on the layers) or design rules (DR) of a feature (e.g., conductive contact, or trace) that is between 9 and 12 micrometers. In some cases, that pitch allows for "flip chip" bonding (e.g., using solder in solder resist openings over level L1) also known as controlled collapse chip connection (C4) bump scaling such as for interconnecting semiconductor devices, such as IC chips and microelectromechanical systems (MEMS), to external circuitry with solder bumps that have been deposited onto the chip pads. In some cases, that pitch is a bump pitch of (e.g., using solder in the openings) between 130 micrometers and 200 micrometers.

Upper contacts 110 and via contacts 112 (e.g., of layers 210-252) may be height H1 (e.g., a thickness) and H2 (e.g., a thickness) respectively; and trace 118 may be height H4 (e.g., a thickness) of solid conductive material. Also, the other upper contacts (e.g., contacts 120, 130 and 140) may be height H1; the other via contacts (e.g., contacts 122, 132 and 142) may be height H4; and the other traces (e.g., traces 128, 138 and 148) may be height H4 of solid conductive material.

In some cases, webbings 160, 162 and 164 (e.g., of layers 210, 220 and 230) are also height H5 (e.g., a thickness) of solid conductive material. The conductive material may be a pure conductor (e.g., a metal or pure conductive material). Such material may be or include copper (Cu), gold, silver, bronze, nickel, silver, aluminum, molybdenum, an alloy, or the like as known for such a contact. In some cases, they are all copper.

In some cases, the contacts, traces and webbing may be formed as a blanket layer of conductor material (e.g., a pure conductive material) that is masked and etched to form openings where dielectric material will be deposited, grown or formed (and leave portions of the conductor material where the contacts, traces and webbing are now formed). Alternatively, the conductor material may be a layer that is formed in openings existing through a patterned mask, and the mask then removed (e.g., dissolved or burned) to form the contacts, traces and webbing. Such forming of the contacts, traces and webbing may include or be depositing the conductor material such as by chemical vapor deposition (CVD) or by atomic layer deposition (ALD); or growing the conductor material such as an electrolytic layer of metal or conductor grown from a seed layer of electroless metal or conductor to form the contacts, traces and webbing.

In some cases, the contacts and traces may be formed by a process known to form such contacts and traces of a package or chip package device. In some cases, the webbings may be formed by a process known to form contacts and traces of a package or chip package device.

Layers of dielectric 103 (e.g., layers 103a-103f; and/or of layers 210-252) may each be a height H1 for an upper layer and height H2 for a lower layer of each level L1-L5 (e.g., H1 plus H2 per each level) of solid non-conductive material. The dielectric material may be a pure non-conductor (e.g., an oxide or pure non-conductive material). Such material may be or include silicon nitride, silicon dioxide, porcelain, glass, plastic, or the like as known for such a dielectric. In some cases it is silicon nitride.

In some cases, the dielectric may be a blanket layer of dielectric material (e.g., a non-conductive insulator material) that is masked and etched to form openings where the contacts, traces and webbing are deposited, grown or formed. Alternatively, the dielectric may be a layer that is formed on a patterned mask, and the mask then removed (e.g., dissolved or burned) to form openings where the contacts, traces and webbing are deposited, grown or formed. Such forming of the dielectric layer, or portions may include or be depositing the dielectric material such as by chemical vapor deposition (CVD) or by atomic layer deposition (ALD); or growing the dielectric material such as from or on a lower surface of a dielectric material (e.g., that may be the same type of material or a different type of dielectric material) to form the layer or portions. In some cases, the dielectric layer, portions of dielectric structure, or openings in dielectric layer may be formed by a process known to form such dielectric of a package or chip package device.

In some cases, the mask used may be a material formed on a surface (e.g., of a layer); and then having a pattern of the mask removed (e.g., dissolved, developed or burned) to form the openings where the conductor material (or dielectric) are to be formed. In some cases, the mask may be patterned using photolithography. In some cases, the mask may be liquid photoimageable "wet" mask or a dry film photoimageable "dry" mask blanket layer sprayed onto the surface; and then masked and exposed to a pattern of light (e.g., the mask is exposed to light where a template of the pattern placed over the mask does not block the light) and developed to form the openings. Depending on the mask type, the exposed or unexposed areas are removed. In some cases, the mask goes through a thermal cure of some type after the openings (e.g., pattern) are defined. In some cases, the mask may be formed by a process known to form such a mask of a chip package, or device formed using a chip package POR.

Figure 4:
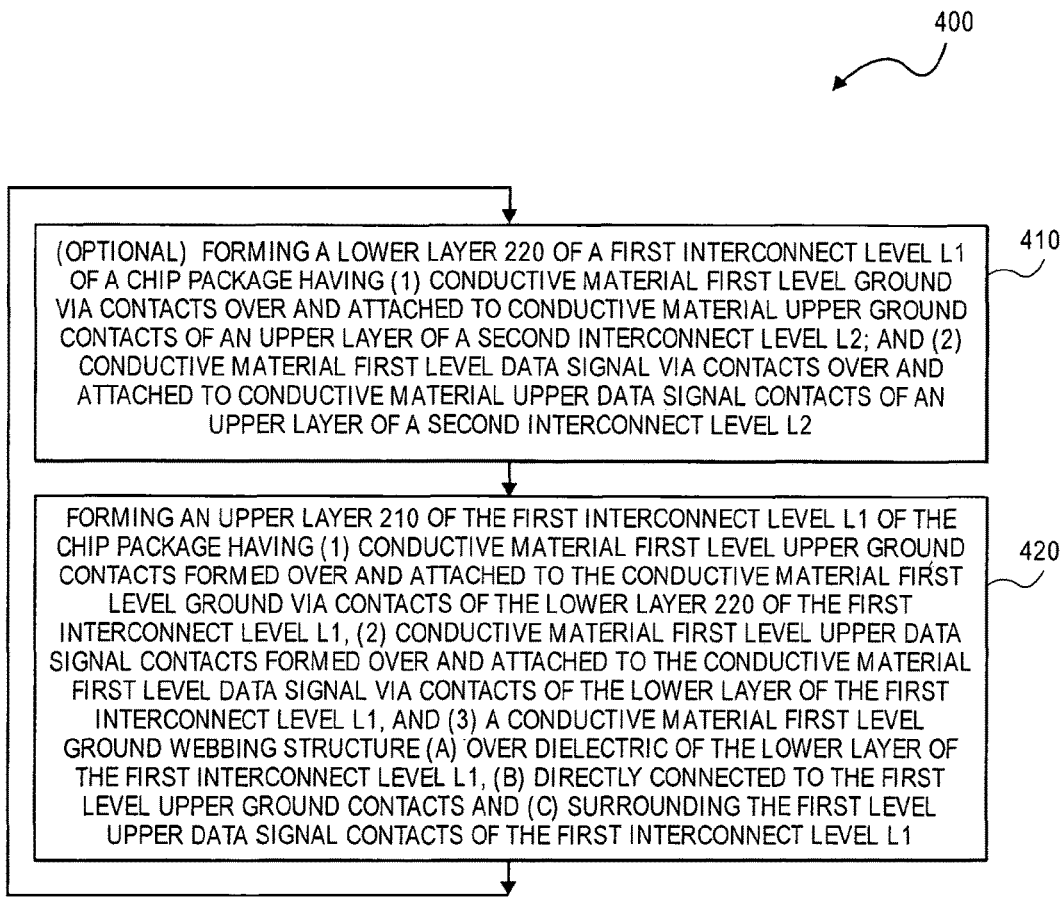
FIG. 4 is a flow chart illustrating a process for forming a ground webbing structure package, according to embodiments described herein.

FIG. 4 is a flow chart illustrating a process for forming a conductive material ground webbing structure package, according to embodiments described herein. FIG. 4 shows process 400 which may be a process for forming embodiments described herein of package 100 of any of FIGS. 1-3 and 5. In some cases, process 400 is a process for forming a ground webbing structure package that includes a first interconnect level with an upper (e.g., top or first) interconnect layer with upper level ground contacts, upper level data signal contacts, and a upper level ground webbing structure that is directly connected (e.g., attached to, formed as part of, or electrically coupled to) to the upper level ground contacts and surrounds the upper data signal contacts.

Process 400 begins at optional block 410 at which a lower layer of a first interconnect level of a chip package is formed, having first level ground via contacts over and attached to upper ground contacts of a second interconnect level, and first level data signal via contacts over and attached to upper data signal contacts of the second interconnect levels of the chip package.

Block 410 may include forming lower layer 212 of a first interconnect level L1 of a chip package 100 having (1) conductive material first level ground via contacts 122 attached to conductive material upper ground contacts 120 of an upper layer 220 of a second interconnect level L2; and (2) conductive material first level data signal via contacts 132 and 142 attached to conductive material upper data signal contacts 130 and 140 of an upper layer 220 of a second interconnect level L2.

Block 410 may include forming via contacts 112, 122, 132, 142 and/or traces of a lower layer 121, 222, 232, 242 or 252 of any interconnect level of levels L1-L5, respectively, as described herein. It may also include forming dielectric 103b of a lower layer 121, 222, 232, 242 or 252 of any interconnect level of levels L1-L5, respectively, as described herein.

In some cases, block 410 may include forming contacts and traces as described herein, such as to form via contacts 112, 122, 132, and/or 142. In some cases, block 410 may include forming dielectric as described herein, such as to form dielectric portions 103b.

In some cases, block 410 may include (e.g., prior to block 420) forming lower layer 212 of first interconnect level L1 having first level ground via contacts 122 and first level data signal via contacts 132 and 142 of level L1; where the first level ground via contacts 122 attach first level upper ground contacts 120 of level L1 to second level upper ground contacts 120 of level L2; the first level upper data signal via contacts 132 and 142 attach the first level upper data signal contacts 130 and 140 to second level upper data signal contacts 130 and 140 of second interconnection level L2 disposed below level L1; and level L2 has second level ground webbing structure 162 directly connected to the second level upper ground contacts 120 and surrounding the second level upper data signal contacts 130 and 140 of level L2.

After block 410, block 420 is performed. Block 420 may include or be forming an upper layer of the first interconnect level of the chip package having (1) conductive material first level upper ground contacts formed over and attached to the conductive material first level ground via contacts of the lower layer of the first interconnect level, (2) conductive material first level upper data signal contacts formed over and attached to the conductive material first level data signal via contacts of the lower layer of the first interconnect level, and (3) a conductive material first level ground webbing structure (a) over dielectric of the lower layer of the first interconnect level, (b) directly connected to the first level upper ground contacts and (c) surrounding the first level upper data signal contacts of the first interconnect level.

In some cases, the ground webbing may be formed directly onto, as part of, or touching the outer edges of the upper ground contacts of the first interconnect level L1. In some cases the ground webbing is physically attached to and electrically coupled by conductor material to the upper ground contacts.

Block 420 may include forming upper layer 210 of the first interconnect level L1 of the chip package 100, layer 210 having (1) conductive material first level upper ground contacts 120 formed over and attached to the conductive material first level ground via contacts 122 of the lower layer 220 of the first interconnect level L1, (2) conductive material first level upper data signal contacts 130 and 140 formed over and attached to the conductive material first level data signal via contacts 132 and 142 of the lower layer 220 of the first interconnect level L1, and (3) a conductive material first level ground webbing structure 160: (a) over dielectric 103b of the lower layer 220 of the first interconnect level L1, (b) directly connected to the first level upper ground contacts 120 and (c) surrounding the first level upper data signal contacts 130 and 140 of the first interconnect level L1.

Block 420 may include forming upper contacts 110, 120, 130, 140 and/or traces of an upper layer 120, 220, 230, 240 or 250 of any interconnect level of levels L1-L5, respectively, as described herein. It may also include forming dielectric 103a of an upper layer 120, 220, 230, 240 or 250 of any interconnect level of levels L1-L5, respectively, as described herein.

In some cases, block 420 may include forming contacts and traces as described herein, such as to form upper contacts 110, 120, 130, and/or 140. In some cases, block 420 may include forming dielectric as described herein, such as to form dielectric portions 103a.

In some cases, block 420 may include forming a conductive material ground webbing structure package 100 by forming upper layer 210 of a first interconnect level L1 having conductive material first level upper ground contacts 120, conductive material first level upper data signal contacts 130 and 140, and conductive material first level ground webbing structure webbing 160, where the first level ground webbing structure 160 is directly connected to the first level ground contacts 120 and surrounds the first level data signal contacts 130 and 140.

A first example embodiments of block 420 may include (e.g., prior to forming the upper Payer 210 of the first interconnect level), forming a mask (e.g., DFR, not shown) over a top surface of a lower layer 212 of the first interconnect level L1, the mask having (1) first openings over ground via contacts 122 of the lower layer 212 and in which to form the first level upper ground contacts 120 of Level L1, (2) second openings over data signal via contacts 132 and 142 of the lower layer 212 and in which to form the first level upper data signal contacts 130 and 140 of Level L1, and (3) third openings over dielectric 103b of the lower layer 212 and in which to form the first level ground webbing structure 160. In this case, the first openings may be horizontally open to and in communication with the third openings. Some of these cases may include electroless plating of a seed layer of the conductor material, prior to forming the masks layer.

In this case, block 420 may then include simultaneously forming conductive material (e.g., plating on the exposed seed layer of the openings) to form the first level upper ground contacts 120 in the first openings, the first level upper data signal contacts 130 and 140 in the second openings, and the first level ground webbing structure 160 in the third openings of Level L1.

In some of these cases, simultaneously forming the conductive material may include forming that conductive material of the contacts 120, 130 and 140; and webbing 160 during the same process, deposition or growth of that conductive material in the first, second and third openings. In some cases, simultaneously forming the conductive material includes electrolytic plating of conductor material in the first, second and third openings (e.g., on the electroless plating of seed layer).

In some cases of these, after simultaneously forming the conductive material, the mask is removed from between the first level upper ground contacts 120, the first level upper data signal contacts 130 and 140, and the first level ground webbing structure 160. This removal may also include removing the seed layer from between the openings. Then dielectric material 103a (e.g., SiO2 or SiN3) is deposited where the mask was removed from between the first level upper ground contacts, the first level upper data signal contacts, and the first level ground webbing structure. In some cases, forming the mask includes forming a blanket layer of mask material and etching the blanket layer to form the first, second and third openings.

A second example of embodiments of block 420 may include (e.g., prior to forming the upper layer 210 of the first interconnect level), forming a blanket layer of dielectric material (e.g., blanket of dielectric 103a prior to etching) over a top surface of a lower layer 212 of the first interconnect level L1. Then forming a mask over a top surface of the blanket layer of dielectric material, the mask having (1) first openings over ground via contacts 122 of the lower layer 212 and in which to form the first level upper ground contacts 120 of Level L1, (2) second openings over data signal via contacts 132 and 142 of the lower layer 212 and in which to form the first level upper data signal contacts 130 and 140 of Level L1, and (3) third openings over dielectric 103b of the lower layer 212 and in which to form the first level ground webbing structure 160. In this case, the first openings may be horizontally open to and in communication with the third openings. Block 420 may then include etching away portions of the blanket layer of dielectric material in the first, second and third openings (e.g., and to the top surface of the lower layer 212). Block 420 may then include simultaneously forming (e.g., plating) conductive material to form the first level upper ground contacts 120 in the first openings, the first level upper data signal contacts 130 and 140 in the second openings, and the first level ground webbing structure 160 in the third openings of Level L1.

In some of these cases, simultaneously forming the conductive material may include forming that conductive material of the contacts 120, 130 and 140; and webbing 160 during the same process, deposition or growth of that conductive material in the first, second and third openings. In some cases, simultaneously forming the conductive material includes electroless plating of a seed layer, and then electrolytic plating of conductor material in the first, second and third openings.

In some of these cases, after simultaneously forming the conductive material in the second example embodiments of block 420, the mask is removed from above the dielectric layer 103a between the first level upper ground contacts 120, the first level upper data signal contacts 130 and 140, and the first level ground webbing structure 160. This leaves dielectric material 103a (e.g., SiO2 or SiN3) between the first level upper ground contacts 120, the first level upper data signal contacts 130 and 140, and the first level ground webbing structure 160.

In some cases, deposition or growing of conductor material in blocks 410 and 420 may be by chemical vapor deposition (CVD) or by atomic layer deposition (ALD). In some cases, deposition or growing of dielectric material in block 410 and 420 may be by chemical vapor deposition (CVD) or by atomic layer deposition (ALD). It can be appreciated that the descriptions herein for blocks 410 and 420 may also include polishing (e.g., chemical mechanical polishing) or planarizing surfaces as needed to perform the descriptions herein of blocks 410 and 420.

It can be appreciated that the descriptions herein for blocks 410 and 420 may be repeated to form additional levels similar to level L1. Such descriptions may include forming additional levels similar to level L1, below level L1 (e.g., to form level L2, etc.); or above level L1 (e.g., to form a new top level L1 such that level L2 is now level L2).

In some cases, only block 420 of process 400 is performed (e.g., to form layer 210). In other cases, only blocks 410-420 of process 400 are performed (e.g., to form layers 210-212). In some cases, block 420 of process 400 may be performed, then block 410, then block 420 repeated for another level (e.g., to form layers 210-232). In some cases, blocks 410 and 420 of process 400 are repeated once (e.g., to form layers 210-222), twice (e.g., to form layers 210-232), thrice (e.g., to form layers 210-242), or four times (e.g., to form layers 210-252).

In some cases, any or all of height H1-H5 may be between 3 and 5 percent less than or greater than that described herein. In some cases, they may be between 5 and 10 percent less than or greater than that described herein.

In some cases, any or all of widths W1-W6 may represent a circular diameter, or the maximum width (maximum distance from one edge to another farthest edge from above) of an oval, a rectangle, a square, a triangle, a rhombus, a trapezoid, or a polygon.

Figure 5:
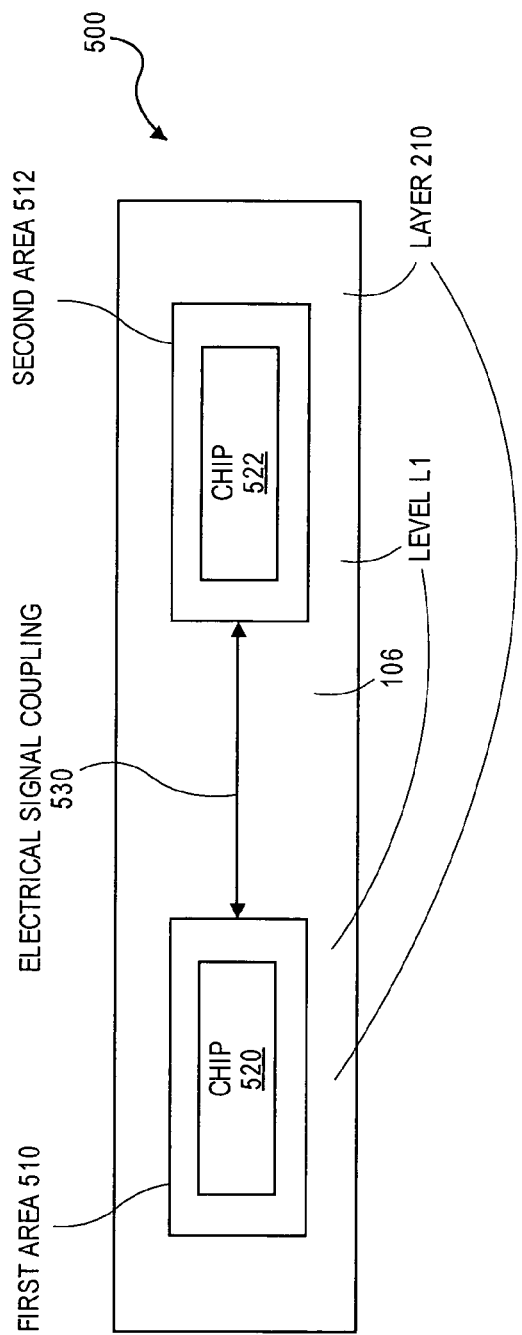
FIG. 5 is a schematic top perspective view of a conductive material ground isolation webbing structure semiconductor device package upon which two integrated circuit (IC) chip or "die" are attached.

In some cases, embodiments of (e.g., packages, systems and processes for forming) a conductive material ground webbing structure package, such as described for FIGS. 1-4, provide quicker and more accurate data signal transfer between the two IC's attached to a package by including a top interconnect layer with a ground webbing structure (e.g., "webbing") of conductor material that reduces bump field crosstalk, signal type cluster-to-cluster crosstalk and in-cluster signal type crosstalk (e.g., see FIG. 5). The ground webbing structure (e.g., of the top interconnect level, and optionally of other levels) may be formed connected to upper grounding contacts to reduce bump field crosstalk, signal type cluster-to-cluster crosstalk and in-cluster signal type crosstalk by surrounding each of the upper transmit and receive data signal contacts.

In some cases, embodiments of processes for forming a conductive material ground webbing structure package, or embodiments of a conductive material ground webbing structure package provide a package having better components for providing stable and clean power (e.g., from contacts 110), ground (e.g., from contacts 120), and high frequency transmit (e.g., from contacts 130) and receive (e.g., from contacts 140) data signals between its top surface 106 (or layer 210) and (1) other components attached to the package, such as at other contacts on the top surface of the package where similar ground webbing structure(s) exist, or (2) other components of lower levels of the package that will be electrically connected to the contacts through via contacts or traces of the package. The components may be better due to the addition of the conductive material ground webbing structure which reduces crosstalk between the data transfer contacts.

In some cases, embodiments of processes for forming a conductive material ground webbing structure package, or embodiments of a conductive material ground webbing structure package provide the benefits embodied in computer system architecture features and interfaces made in high volumes. In some cases, embodiments of such processes and devices provide all the benefits of solving very high frequency data transfer interconnect problems, such as between two IC chips or die (e.g., where hundreds even thousands of signals between two die need to be routed), or for high frequency data transfer interconnection within a system on a chip (SoC) (e.g., see FIG. 5). In some cases, embodiments of such processes and devices provide the demanded lower cost high frequency data transfer interconnects solution that is needed across the above segments. These benefits may be due to the addition of the conductive material ground webbing structure which reduces crosstalk between the data transfer contacts.

In some cases, embodiments of processes for forming a conductive material ground webbing structure package or embodiments of a conductive material ground webbing structure package provide ultra-high frequency data transfer interconnect in a standard package, such as a flip-chip x grid array (FCxGA), where 'x' can be ball, pin, or land, or a flip-chip chip scale package (FCCSP, etc.) due to the addition of the conductive material ground webbing structure which reduce crosstalk between the data transfer contacts.

In addition to this, such processes and devices can provide for direct and local power, ground and data signal delivery to both chips. In some cases, embodiments of such processes and devices provide communication between two IC chips or board ICs including memory, modem, graphics, and other functionality, directly attached to each other (e.g., see FIG. 5). These processes and devices provide increased input/output (IO) frequency data transfer at lower cost. These provisions and increases may be due to the addition of the conductive material ground webbing structure which reduces crosstalk between the data transfer contacts.

FIG. 5 is a schematic top perspective view of a conductive material ground isolation webbing structure semiconductor device package upon which two integrated circuit (IC) chip or "die" are attached. FIG. 5 shows isolation webbing structure package 500 having first area 510 upon which IC chip 520 is mounted; second area 512 upon which second IC chip 522 is mounted; and electrical signal coupling 530 electrically coupling signals of area 510 to signals of area 512. Area 510 may include descriptions herein for package 100, such as by including zones 102, 104, 105 and 107 (and interconnect levels and stacks thereof). Area 512 may also include descriptions herein for package 100, such as by including zones 102, 104, 105 and 107 (and interconnect levels and stacks thereof). In some cases, package 500 represents package 100 of any of FIGS. 1-4, having two areas with the structures shown in those figures.

Coupling 530 may include contacts, interconnects, traces, circuitry, and other features known for transmitting signals between area 510 and 512. For example, coupling 530 may include electronics data signal traces for communicating signals from receive contacts 130 of zone 510 to transmit contact 540 of zone 512. Coupling 530 may also include electronics data signal traces for communicating signals from receive contacts 130 of zone 512 to transmit contact 540 of zone 510. Coupling 530 may also include ground traces or planes for providing ground signals to contacts 120 of areas 510 and 512. Coupling 530 may also include power traces or planes for providing power signals to contacts 110 of areas 510 and 512. Area 510 may include ground webbing 160, and optionally 162, and optionally 164, as described herein. Area 512 may include ground webbing 160, and optionally 162, and optionally 164, as described herein.

FIG. 5 may describe a cases where one IC chip 520 is mounted in area 510 on top surface 106 (having level L1) of microelectronic substrate package 500, while package 500 is also physically and electronically connected to another IC chip 522 in area 512 on top surface 106 (having level L1), so that package 500 can provide data signal transfer between the two IC chips. Package 500 (e.g., coupling 530) may route hundreds or even thousands of high frequency data signals between chips 520 and 522 (e.g., between data signal contacts of those chips). Package 500 may be similar to package 100, and may have two areas 510 and 512, each with ground webbing (e.g., such as webbing 160) upon which or under which chips 520 and 522 are mounted, respectively. Package 500 (e.g., each of areas 510 and 512) may be formed of materials, have levels L1-L5, have ground webbings, have similar electrical characteristics, and have similar functional capabilities, and may be formed using a process (e.g., see FIG. 4) as described for forming package 100.

In some cases, embodiments of (e.g., packages, systems and processes for forming) a conductive material ground webbing structure package 500, provides quicker and more accurate data signal transfer between the two IC chips 520 and 522 attached to the package by including a top interconnect layer 210 with a ground webbing structure 160 (e.g., see FIGS. 1-3) of conductor material in each of areas 510 and 512 that reduces bump field crosstalk, signal type cluster-to-cluster crosstalk and in-cluster signal type crosstalk in each of areas 510 and 512. Ground webbing structures 160 (e.g., of the top interconnect level L1, and optionally webbings 162 and 164 of levels L2-L3) may be formed connected to upper grounding contacts 120 in each of areas 510 and 512, to reduce bump field crosstalk, signal type cluster-to-cluster crosstalk and in-cluster signal type crosstalk by surrounding each of the upper transmit and receive data signal contacts in each of areas 510 and 512 (e.g., see FIGS. 1-3). In some cases, webbing structures 160 at areas 510 and 512 reduce bump field crosstalk, signal type cluster-to-cluster crosstalk and in-cluster signal type crosstalk as described for package 100.

In some cases, chip 520 and 522 may each be an IC chip type as described for attaching to package 100, such as a microprocessor, coprocessor, graphics processor, memory chip, modem chip, a next-level component, or other microelectronic chip device. In some cases, they are different IC chip types. In some cases, they are the same IC chip type. In some cases, they are both a microprocessor, coprocessor, or graphics processor. In some cases, one is a memory chip and the other is a microprocessor, coprocessor, or graphics processor.

Electrical coupling 530 may include circuitry between area 510 first interconnect level L1 and area 512 first interconnect level L1 to communicate data signals between the chip 520 and chip 522. In some cases, electrical coupling 530, area 510 ground webbing structure (e.g., webbing 160 and optionally webbing 162 and optionally webbing 164 at area 510) and area 512 ground webbing structure (e.g., webbing 160 and optionally webbing 162 and optionally webbing 164 at area 510) are electrically connected to communicate data signals between the chip 520 and chip 522 at a frequency of between 7 and 25 GT/s. In some cases, they are connected to communicate from very low frequency transfer such as from 50 mega hertz (MHz) to a GHz transfer level, such as greater than 40 GHz (or up to between 40 and 50 GHz).

Some embodiments of package 500 exclude chips 520 and 522. Here, package 500 includes a first set of zones 102, 104, (105 and 107) of area 510, are connected or electrically coupled (e.g., through coupling 530) to a second set of corresponding zones 102, 104, (105 and 107) of area 512 through traces 138, 148, (118 and 128) respectively (e.g., see FIGS. 2A-B). The first set of zones 102 and 104 of area 510 may be connected or electrically coupled to a second set of corresponding zones 104 and 102 of area 512 respectively so that the transmit signal zone 102 of the first set as shown is connected to the receive signal zone 104 of the second set, and vice versa. In this case, the first set of zones of area 510 may be configured to be connectable to a chip (e.g., chip 520 at level L1) and the second set of zones of area 512 may be configured to be connectable to a chip (e.g., chip 522 at level L1) so that the first and second IC chips or devices can exchange data (e.g., using transmit data signals and receive data signals as noted above) using zones 102 and 104 of package 500. This provides a benefit of reduced cross talk as noted herein during such data exchange due to or based on use ground webbings 160, 162 and 164. In this case, package 500 may operate to link the first and second IC chips.

In some certain embodiments, descriptions herein for "each" or "each of" a feature, such as in "each of rows 170-190", "each of the contacts", "each zone", "each of zones 102 and 104", "each of zones 105 and 107", "each of levels L1-L5"; the like for rows 170-190; the like for the contacts (e.g., contacts 120, 130 or 140); the like for zones 102, 104, 105 or 107; or the like for levels L1, L2, L3, L4 and L5 may be for most of those features or for less than all of those feature in that row, zone or level. In some cases they may refer to between 80 and 90 percent of those features existing in that row, zone or level.

Figure 6:
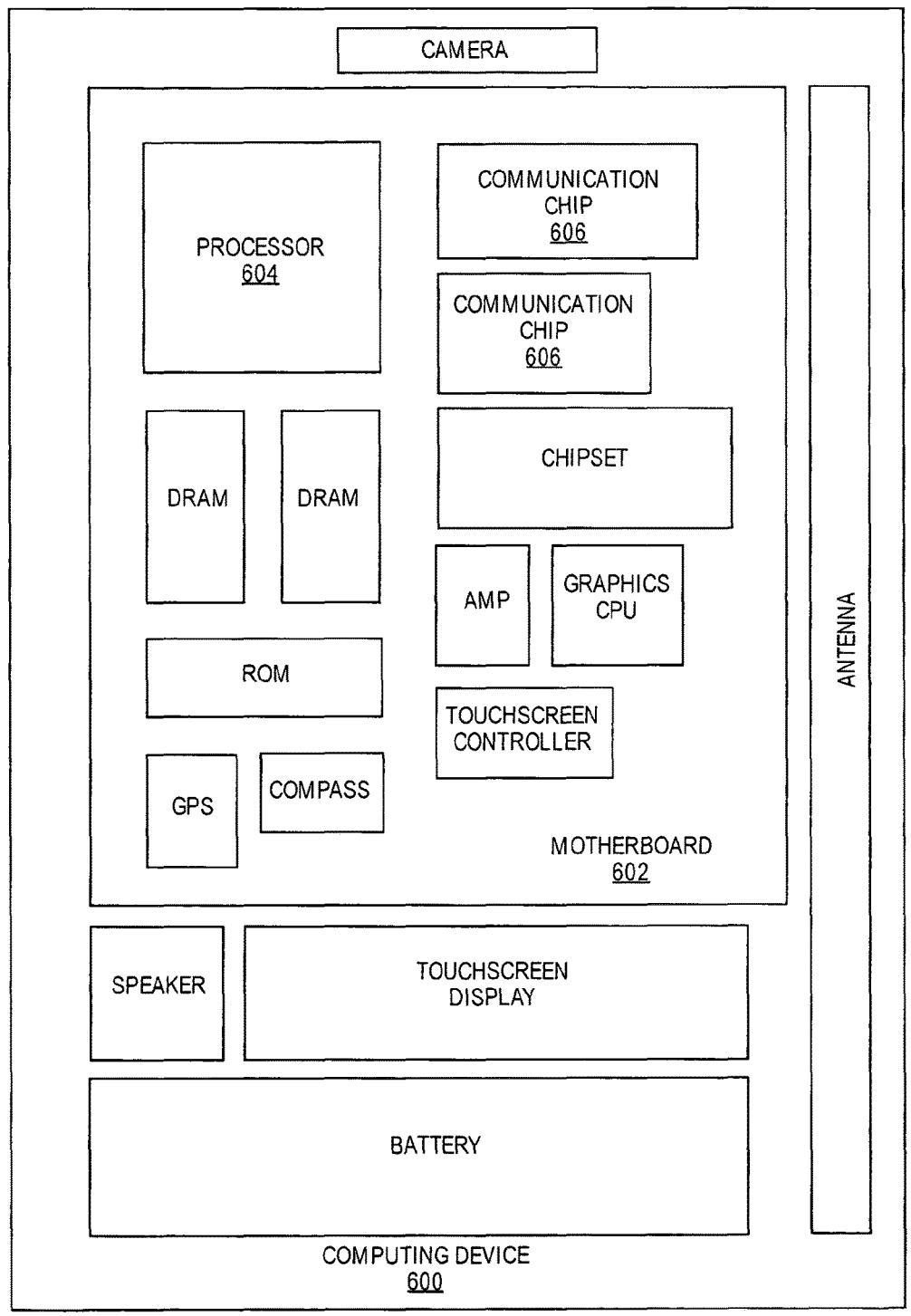
FIG. 6 illustrates a computing device in accordance with one implementation.

FIG. 6 illustrates a computing device in accordance with one implementation. FIG. 6 illustrates computing device 600 in accordance with one implementation. Computing device 600 houses board 602. Board 602 may include a number of components, including but not limited to processor 604 and at least one communication chip 606. Processor 604 is physically and electrically coupled to board 602. In some implementations at least one communication chip 606 is also physically and electrically coupled to board 602. In further implementations, communication chip 606 is part of processor 604.

Depending on its applications, computing device 600 may include other components that may or may not be physically and electrically coupled to board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, first communication chip 606 may be dedicated to shorter range wireless communications such as Wi-Fi and Bluetooth and second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. In some implementations, the integrated circuit die of the processor includes one or more devices, such as transistors or metal interconnects. In some embodiments, the package of the integrated circuit die or processor 604 includes embodiments of processes for forming a "ground webbing structure package" or embodiments of a "ground webbing structure package" as described herein. The term "processor" may refer to any device or portion of a device that processes electronic data from registers and/or memory to transform that electronic data into other electronic data that may be stored in registers and/or memory.

Communication chip 606 also includes an integrated circuit die packaged within communication chip 606. In accordance with another implementation, the integrated circuit die of the communication chip includes one or more devices, such as transistors or metal interconnects. In some embodiments, the package of the integrated circuit die or chip 606 includes embodiments of processes for forming a "ground webbing structure package" or embodiments of a "ground webbing structure package" as described herein.

In further implementations, another component housed within computing device 600 may contain an integrated circuit die that includes one or more devices, such as transistors or metal interconnects. In some embodiments, the package of the other integrated circuit die or chip includes embodiments of processes for forming a "ground webbing structure package" or embodiments of a "ground webbing structure package" as described herein.

In various implementations, computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

Examples

The following examples pertain to embodiments.

Example 1 is a ground webbing structure package including a first interconnect level having an upper layer with first level ground contacts, first level data signal contacts, and a first level ground webbing structure; the first level ground webbing structure directly connected to the first level ground contacts and surrounding the first level data signal contacts.

In Example 2, the subject matter can optionally include the package of Example 1, the first interconnect level further including first level power contacts; and the first level data signal contacts including first level receive data signal contacts and first level transmit data signal contacts.

In Example 3, the subject matter can optionally include the package of Example 2, the first interconnect level having (1) a first level power and ground isolation zone, (2) a first level receive signal zone, and (3) a first level transmit signal zone; the first level power contacts and the first level ground isolation contacts disposed within a first level power and ground isolation zone; the first level receive signal contacts disposed within a first level receive signal zone that is adjacent to a first side of the first level power and ground isolation zone; the first level transmit signal contacts disposed within a first level transmit signal zone that is adjacent to an opposite side of the first level power and ground isolation zone; and the first level ground webbing structure extending from the first level ground isolation contacts through the first side and into the first level receive signal zone; and the first level ground webbing structure extending from the first level ground isolation contacts through the opposite side and into the first level transmit signal zone.

In Example 4, the subject matter can optionally include the package of Example 1, further including a second interconnect level below the first interconnect level, the second interconnect level having second level ground contacts, second level data signal contacts, and a second level ground webbing structure; and the second level ground webbing structure directly connected to the second level ground contacts and surrounding the second level data signal contacts.

In Example 5, the subject matter can optionally include the package of Example 4, further including first level ground via contacts connecting the first level ground signal contacts to the second level ground signal contacts; and first level data signal via contacts connecting the first level data signal contacts to the second level data signal contacts.

In Example 6, the subject matter can optionally include the package of Example 5, the second interconnect level further including second level power contacts; the second level data signal contacts including second level receive data signal contacts, and second level transmit data signal contacts.

In Example 7, the subject matter can optionally include the package of Example 1, wherein the first level ground webbing structure is connected to electrical grounding to reduce bump field crosstalk, signal type cluster-to-cluster crosstalk and in-cluster signal type crosstalk.

In Example 8, the subject matter can optionally include the package of Example 1, wherein the first level ground webbing structure is connected to electrical grounding and the first level data signal contacts are connected communicate data to a device at a frequency of between 7 and 25 GT/s.

Example 9 is a system for communicating with an integrated circuit (IC) chip including the IC chip mounted on a ground webbing structure package, the ground webbing structure package including a first area having a first interconnect level having an upper layer with first level ground contacts, first level data signal contacts, and a first level ground webbing structure; the first level ground webbing structure directly connected to the first level ground contacts and surrounding the first level data signal contacts; and data signal contacts of the IC chip electrically coupled to the first level data signal contacts of the package.

In Example 10, the subject matter can optionally include the system of Example 9, wherein ground contacts of the IC chip are electrically coupled to the first level ground contacts of the package.

In Example 11, the subject matter can optionally include the system of Example 10, wherein the first level ground webbing structure provides quicker and more accurate data signal transfer through the first level data signal contacts, through first level data signal via contacts of the first level and through second level data signal contacts of a second level of the package.

In Example 12, the subject matter can optionally include the system of Example 9, wherein the IC chip is a first IC chip and the ground webbing structure is a first ground webbing structure; the system further including a second IC chip mounted on the ground webbing structure package, the ground webbing structure package including a second area having a second area first interconnect level having an upper layer with first level ground contacts, first level data signal contacts, and a second area first level ground webbing structure; the second area first level ground webbing structure directly connected to the first level ground contacts and surrounding the first level data signal contacts of the second area; and data signal contacts of the second IC chip electrically coupled to the first level data signal contacts of the second area.

In Example 13, the subject matter can optionally include the system of Example 12, wherein the package includes electrical coupling between the first area first interconnect level and the second area first interconnect level to communicate data signals between the first IC chip and the second IC chip.

In Example 14, the subject matter can optionally include the system of Example 13, wherein the first area ground webbing structure and the second area ground webbing structure reduce bump field crosstalk, signal type cluster-to-cluster crosstalk and in-cluster signal type crosstalk.

In Example 15, the subject matter can optionally include the system of Example 12, wherein the electrical coupling, the first area ground webbing structure and the second area ground webbing structure are electrically connected to communicate data signals between the first IC chip and the second IC chip at a frequency of between 7 and 25 GT/s.

Example 16 is a method of forming a conductive material ground webbing structure package including forming an upper layer of a first interconnect level having conductive material first level upper ground contacts, conductive material first level upper data signal contacts, and a conductive material first level ground webbing structure; the first level ground webbing structure directly connected to the first level upper ground contacts and surrounding the first level upper data signal contacts.

In Example 17, the subject matter can optionally include the method of Example 16, further including, prior to forming the upper layer of the first interconnect level forming a lower layer of the first interconnect level having first level ground via contacts and first level data signal via contacts; the first level ground via contacts attaching the first level upper ground contacts to second level upper ground contacts; and the first level data signal via contacts attaching the first level upper data signal contacts to second level upper data signal contacts of a second interconnect level disposed below the first interconnect level; the second interconnect level having a second level ground webbing structure directly connected to the second level upper ground contacts and surrounding the second level upper data signal contacts.

In Example 18, the subject matter can optionally include the method of Example 16, wherein forming the upper layer of the first interconnect level includes forming a mask over a top surface of a lower layer of the first interconnect level, the mask having (1) first openings over ground via contacts of the lower layer and in which to form the first level upper ground contacts, (2) second openings over data signal via contacts of the lower layer and in which to form the first level upper data signal contacts, and (3) third openings over dielectric of the lower layer and in which to form the first level ground webbing structure; the first openings horizontally open to and in communication with the third openings; then simultaneously forming the first level upper ground contacts in the first openings, the first level upper data signal contacts in the second openings, and the first level ground webbing structure in the third openings.

In Example 19, the subject matter can optionally include the method of Examples 18, further including after simultaneously forming, removing the mask from between the first level upper ground contacts, the first level upper data signal contacts, and the first level ground webbing structure; then depositing dielectric where the mask was removed from between the first level upper ground contacts, the first level upper data signal contacts, and the first level ground webbing structure.

In Example 20, the subject matter can optionally include the method of Example 16, the first level upper ground contacts, the first level upper data signal contacts, and first level ground webbing structure formed of the same conductor material during the same process, deposition or growth of the conductor material; wherein forming the mask includes forming a blanket layer of mask material and etching the blanket layer to form the first, second and third openings; and wherein simultaneously forming includes electroless plating of a seed layer and then electrolytic plating of the conductor material in the first, second and third openings.

In Example 21, the subject matter can optionally include the method of Example 16, wherein forming the upper layer of the first interconnect level includes forming a blanket layer of dielectric material over a lower layer of the first interconnect level; forming a mask over a top surface of the blanket layer of dielectric material, the mask having (1) first openings over ground via contacts of the lower layer in which to form the first level upper ground contacts, (2) second openings over data signal via contacts of the lower layer in which to form the first level upper data signal contacts, and (3) third openings over dielectric of the lower layer in which to form the first level ground webbing structure; the first openings horizontally open to and in communication with the third openings; then etching away portions of the blanket layer of dielectric material in the first, second and third openings, and to the top surface of the lower layer; then simultaneously forming the first level upper ground contacts in the first openings, the first level upper data signal contacts in the second openings, and the ground webbing structure in the third openings formed in the blanket layer of dielectric material.

In Example 22, the subject matter can optionally include an apparatus including means for performing the method of any one of Examples 16-21.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize. These modifications may be made to the invention in light of the above detailed description. For example, although the descriptions above show only webbing structures 160, 162 and 164, at levels L1, L2 and L3, those descriptions can apply to fewer, more or different webbing structures. Embodiments of fewer such structures may be where only one or two of structures 160, 162 and 164 exist. Embodiments of more of such structures may be where additional webbing structures (in addition to structures 160, 162 and 164) similar to one of structures 160, 162 and 164 exist at a different level such as level L5 and/or level L4. Embodiments of different of such structures may be such as where structure 164 exists on Level L4 instead of level L3; or where structure 164 exists on Level L5 instead of level L3.

Also, although the descriptions above show only zones 102, 104, 105 and 107 of package 100 (e.g., having webbing structures 160, 162 and 164, at levels L1, L2 and L3), those descriptions can apply to more or different number of zones 102, 104, 105 and 107. Embodiments of different of such zones 102, 104, 105 and 107 may be such as where any one or two of zones 102, 104, or 105 does not exist.

Embodiments of more of such zones may be where a first set of zones 102, 104, (105 and 107) as shown, are connected or electrically coupled to a second set of corresponding zones 102, 104, (105 and 107), such as through traces 138, 148, (118 and 128) respectively (e.g., see FIG. 5). In this case, the first set of zones 102 and 104 may be connected or electrically coupled to a second set of corresponding zones 104 and 102 respectively so that the transmit signal zone 102 of the first set as shown is connected to the receive signal zone 104 of the second set, and vice versa. In this case, the first set of zones may be connected to a first IC chip or device (e.g., at level L1) and the second set of zones may be connected to a second, different IC chip or device (e.g., at level L1) so that the first and second IC chips or devices can exchange data (e.g., using transmit data signals and receive data signals as noted above) using zones 102 and 104 of package 100. This provides a benefit of reduced cross talk as noted herein during such data exchange due to or based on use ground webbings 160, 162 and 164. In this case, package 100 may operate to link the first and second IC chips.

The terms used in the following claims should not be construed to limit the invention to the specific implementations disclosed in the specification and the claims. Rather, the scope is to be determined entirely by the following claims, which are to be construed in accordance with established doctrines of claim interpretation.

The invention claimed is:

1. A ground webbing structure package comprising:
a first interconnect level having an upper layer with first level ground contacts, first level data signal contacts, and a first level ground webbing structure, the first level ground webbing structure directly connected to the first level ground contacts and surrounding the first level data signal contacts, the first interconnect level further comprising first level power contacts and the first level data signal contacts including first level receive data signal contacts and first level transmit data signal contacts, and the first interconnect level having (1) a first level power and ground isolation zone, (2) a first level receive signal zone, and (3) a first level transmit signal zone;
the first level power contacts and the first level ground isolation contacts disposed within a first level power and ground isolation zone;
the first level receive signal contacts disposed within a first level receive signal zone that is adjacent to a first side of the first level power and ground isolation zone;
the first level transmit signal contacts disposed within a first level transmit signal zone that is adjacent to an opposite side of the first level power and ground isolation zone; and
the first level ground webbing structure extending from the first level ground isolation contacts through the first side and into the first level receive signal zone; and
the first level ground webbing structure extending from the first level ground isolation contacts through the opposite side and into the first level transmit signal zone.

2. The package of claim 1, wherein the first level ground webbing structure is connected to electrical grounding to reduce bump field crosstalk, signal type cluster-to-cluster crosstalk and in-cluster signal type crosstalk.

3. The package of claim 1, wherein the first level ground webbing structure is connected to electrical grounding and the first level data signal contacts are connected communicate data to a device at a frequency of between 7 and 25 GT/s.

4. A ground webbing structure package comprising:
a first interconnect level having an upper layer with first level ground contacts, first level data signal contacts, and a first level ground webbing structure;
the first level ground webbing structure directly connected to the first level ground contacts and surrounding the first level data signal contacts;
a second interconnect level below the first interconnect level, the second interconnect level having second level ground contacts, second level data signal contacts, and a second level ground webbing structure; and
the second level ground webbing structure directly connected to the second level ground contacts and surrounding the second level data signal contacts.

5. The package of claim 4, further comprising:
first level ground via contacts connecting the first level ground signal contacts to the second level ground signal contacts; and
first level data signal via contacts connecting the first level data signal contacts to the second level data signal contacts.

6. The package of claim 5, the second interconnect level further comprising second level power contacts;
the second level data signal contacts including second level receive data signal contacts, and second level transmit data signal contacts.

7. A system for communicating with an integrated circuit (IC) chip comprising:
the IC chip mounted on a ground webbing structure package, the ground webbing structure package including a first area having:
a first interconnect level having an upper layer with first level ground contacts, first level data signal contacts, and a first level ground webbing structure;
the first level ground webbing structure directly connected to the first level ground contacts and surrounding the first level data signal contacts; and
data signal contacts of the IC chip electrically coupled to the first level data signal contacts of the package, wherein ground contacts of the IC chip are electrically coupled to the first level ground contacts of the package.

8. The system of claim 7, wherein the first level ground webbing structure provides quicker and more accurate data signal transfer through the first level data signal contacts, through first level data signal via contacts of the first level and through second level data signal contacts of a second level of the package.

9. A system for communicating with an integrated circuit (IC) chip comprising:
the IC chip mounted on a ground webbing structure package, the ground webbing structure package including a first area having:
a first interconnect level having an upper layer with first level ground contacts, first level data signal contacts, and a first level ground webbing structure;

the first level ground webbing structure directly connected to the first level ground contacts and surrounding the first level data signal contacts;

data signal contacts of the IC chip electrically coupled to the first level data signal contacts of the package, wherein the IC chip is a first IC chip and the ground webbing structure is a first ground webbing structure;

a second IC chip mounted on the ground webbing structure package, the ground webbing structure package including a second area having: a second area first interconnect level having an upper layer with first level ground contacts, first level data signal contacts, and a second area first level ground webbing structure; the second area first level ground webbing structure directly connected to the first level ground contacts and surrounding the first level data signal contacts of the second area; and data signal contacts of the second IC chip electrically coupled to the first level data signal contacts of the second area.

10. The system of claim 9, wherein the electrical coupling, the first area ground webbing structure and the second area ground webbing structure are electrically connected to communicate data signals between the first IC chip and the second IC chip at a frequency of between 7 and 25 GT/s.

11. The system of claim 9, wherein the package includes electrical coupling between the first area first interconnect level and the second area first interconnect level to communicate data signals between the first IC chip and the second IC chip.

12. The system of claim 11, wherein the first area ground webbing structure and the second area ground webbing structure reduce bump field crosstalk, signal type cluster-to-cluster crosstalk and in-cluster signal type crosstalk.

13. A method of forming a conductive material ground webbing structure package comprising:
forming a lower layer of a first interconnect level having first level ground via contacts and first level data signal via contacts;
the first level ground via contacts attaching the first level upper ground contacts to second level upper ground contacts; and
the first level data signal via contacts attaching the first level upper data signal contacts to second level upper data signal contacts of a second interconnect level disposed below the first interconnect level;
the second interconnect level having a second level ground webbing structure directly connected to the second level upper ground contacts and surrounding the second level upper data signal contacts;
forming an upper layer of the first interconnect level having conductive material first level upper ground contacts, conductive material first level upper data signal contacts, and a conductive material first level ground webbing structure;
the first level ground webbing structure directly connected to the first level upper ground contacts and surrounding the first level upper data signal contacts.

14. A method of forming a conductive material ground webbing structure package comprising:
forming an upper layer of a first interconnect level having conductive material first level upper ground contacts, conductive material first level upper data signal contacts, and a conductive material first level ground webbing structure;
the first level ground webbing structure directly connected to the first level upper ground contacts and surrounding the first level upper data signal contacts, wherein forming the upper layer of the first interconnect level comprises:
forming a mask over a top surface of a lower layer of the first interconnect level, the mask having (1) first openings over ground via contacts of the lower layer and in which to form the first level upper ground contacts, (2) second openings over data signal via contacts of the lower layer and in which to form the first level upper data signal contacts, and (3) third openings over dielectric of the lower layer and in which to form the first level ground webbing structure;
the first openings horizontally open to and in communication with the third openings;
then simultaneously forming the first level upper ground contacts in the first openings, the first level upper data signal contacts in the second openings, and the first level ground webbing structure in the third openings.

15. The method of claim 14, further comprising:
after simultaneously forming, removing the mask from between the first level upper ground contacts, the first level upper data signal contacts, and the first level ground webbing structure;
then depositing dielectric where the mask was removed from between the first level upper ground contacts, the first level upper data signal contacts, and the first level ground webbing structure.

16. A method of forming a conductive material ground webbing structure package comprising:
forming an upper layer of a first interconnect level having conductive material first level upper ground contacts, conductive material first level upper data signal contacts, and a conductive material first level ground webbing structure;
the first level ground webbing structure directly connected to the first level upper ground contacts and surrounding the first level upper data signal contacts, the first level upper ground contacts, the first level upper data signal contacts, and first level ground webbing structure formed of the same conductor material during the same process, deposition or growth of the conductor material;
wherein forming the mask includes forming a blanket layer of mask material and etching the blanket layer to form the first, second and third openings; and
wherein simultaneously forming includes electroless plating of a seed layer and then electrolytic plating of the conductor material in the first, second and third openings.

17. A method of forming a conductive material ground webbing structure package comprising:
forming an upper layer of a first interconnect level having conductive material first level upper ground contacts, conductive material first level upper data signal contacts, and a conductive material first level ground webbing structure;
the first level ground webbing structure directly connected to the first level upper ground contacts and surrounding the first level upper data signal contacts, wherein forming the upper layer of the first interconnect level comprises:
forming a blanket layer of dielectric material over a lower layer of the first interconnect level;
forming a mask over a top surface of the blanket layer of dielectric material, the mask having (1) first openings over ground via contacts of the lower layer in which to form the first level upper ground contacts, (2) second openings over data signal via contacts of the lower layer in which to form the first level upper data signal contacts, and (3) third openings over dielectric of the lower layer in which to form the first level ground webbing structure;

the first openings horizontally open to and in communication with the third openings;

then etching away portions of the blanket layer of dielectric material in the first, second and third openings, and to the top surface of the lower layer;

then simultaneously forming the first level upper ground contacts in the first openings, the first level upper data signal contacts in the second openings, and the ground webbing structure in the third openings formed in the blanket layer of dielectric material.

* * * * *